United States Patent
Wan

(10) Patent No.: US 8,928,602 B1
(45) Date of Patent: *Jan. 6, 2015

(54) METHODS AND APPARATUS FOR OBJECT TRACKING ON A HAND-HELD DEVICE

(75) Inventor: Hong Wan, Plymouth, MN (US)

(73) Assignee: mCube Inc., San Jose, CA (US)

( * ) Notice: Subject to any disclaimer, the term of this patent is extended or adjusted under 35 U.S.C. 154(b) by 28 days.

This patent is subject to a terminal disclaimer.

(21) Appl. No.: 12/940,026

(22) Filed: Nov. 4, 2010

(51) Int. Cl.
*G06F 3/041* (2006.01)
*G01R 33/06* (2006.01)
*G06F 3/046* (2006.01)

(52) U.S. Cl.
USPC ............ 345/173; 324/251; 178/18.07

(58) Field of Classification Search
CPC ........ G06F 3/046; G01R 33/18; G01R 15/20; G01R 33/0011; G01R 33/07
USPC .......... 345/173, 174, 175; 324/251, 252, 244, 324/247; 178/18.07
See application file for complete search history.

(56) References Cited

U.S. PATENT DOCUMENTS

| | | |
|---|---|---|
| 3,614,677 A | 10/1971 | Wilfinger |
| 4,954,698 A | 9/1990 | Yasunaga et al. |
| 5,140,745 A | 8/1992 | McKenzie |
| 5,157,841 A | 10/1992 | Dinsmore |
| 5,173,597 A | 12/1992 | Anglin |
| 5,488,765 A | 2/1996 | Kubota et al. |
| 5,493,769 A | 2/1996 | Sakai et al. |
| 5,610,414 A | 3/1997 | Yoneda et al. |
| 5,668,033 A | 9/1997 | Ohara |
| 5,729,074 A | 3/1998 | Shiomi et al. |
| 6,046,409 A | 4/2000 | Ishii et al. |
| 6,076,731 A | 6/2000 | Terrell |
| 6,115,261 A | 9/2000 | Platt et al. |
| 6,188,322 B1 | 2/2001 | Yao |
| 6,263,736 B1 | 7/2001 | Thunder et al. |
| 6,278,178 B1 | 8/2001 | Kwon et al. |
| 6,480,699 B1 | 11/2002 | Lovoi |
| 6,483,172 B1 | 11/2002 | Cote |
| 6,485,273 B1 | 11/2002 | Goodwin-Johansson |
| 6,534,726 B1 | 3/2003 | Okada et al. |
| 6,576,999 B2 | 6/2003 | Sakai et al. |
| 6,656,604 B2 | 12/2003 | Hasewaga |
| 6,753,664 B2 | 6/2004 | Neufeld et al. |

(Continued)

OTHER PUBLICATIONS

Notice of Allowance for U.S. Appl. No. 12/940,023, mailed on Apr. 16, 2012, 8 pages.

(Continued)

*Primary Examiner* — Lun-Yi Lao
*Assistant Examiner* — Ibrahim Khan
(74) *Attorney, Agent, or Firm* — Kilpatrick Townsend and Stockton LLP

(57) ABSTRACT

A handheld device includes a housing, a display, a MEMS magnetic field sensor disposed within the housing, wherein the MEMS magnetic field sensor is configured to sense a plurality of perturbations in magnetic fields in response to a perturbation source when the user displaces the perturbation source proximate to the handheld device, and a processor disposed within the housing and coupled to the MEMS magnetic field sensor and to the display, wherein the processor is programmed to receive the plurality of perturbations in magnetic fields, wherein the processor is programmed to determine a plurality of spatial locations in at least two-dimensions in response to the plurality of perturbations, and wherein the processor is programmed output an indication of the plurality of spatial locations on the display.

20 Claims, 12 Drawing Sheets

(56) References Cited

U.S. PATENT DOCUMENTS

| | | | |
|---|---|---|---|
| 6,855,572 B2 | 2/2005 | Jeung | |
| 6,912,336 B2 | 6/2005 | Ishii | |
| 6,933,165 B2 | 8/2005 | Musolf et al. | |
| 6,979,872 B2 | 12/2005 | Borwick | |
| 7,019,434 B2 | 3/2006 | Helmbrecht | |
| 7,095,226 B2 | 8/2006 | Wan et al. | |
| 7,145,555 B2* | 12/2006 | Taylor et al. | 345/173 |
| 7,183,630 B1 | 2/2007 | Fogelson et al. | |
| 7,193,312 B2 | 3/2007 | Boon et al. | |
| 7,195,945 B1 | 3/2007 | Edelstein et al. | |
| 7,239,000 B2 | 7/2007 | Witcraft | |
| 7,253,079 B2 | 8/2007 | Hanson et al. | |
| 7,258,009 B2 | 8/2007 | Imai | |
| 7,358,724 B2 | 4/2008 | Taylor et al. | |
| 7,370,530 B2 | 5/2008 | DCamp et al. | |
| 7,391,091 B2 | 6/2008 | Tondra | |
| 7,402,449 B2 | 7/2008 | Fukuda et al. | |
| 7,453,269 B2 | 11/2008 | Won et al. | |
| 7,454,705 B2 | 11/2008 | Cadez et al. | |
| 7,456,042 B2 | 11/2008 | Stark et al. | |
| 7,498,715 B2 | 3/2009 | Yang | |
| 7,511,379 B1 | 3/2009 | Flint | |
| 7,514,760 B1 | 4/2009 | Quevy | |
| 7,521,783 B2 | 4/2009 | Tsai et al. | |
| 7,536,909 B2 | 5/2009 | Zhao et al. | |
| 7,585,750 B2 | 9/2009 | Do et al. | |
| 7,599,277 B1 | 10/2009 | Kato et al. | |
| 7,612,443 B1 | 11/2009 | Bernstein et al. | |
| 7,671,478 B2 | 3/2010 | Wathanawasam et al. | |
| 7,676,340 B2 | 3/2010 | Yasui | |
| 7,690,255 B2 | 4/2010 | Gogoi et al. | |
| 7,708,189 B1 | 5/2010 | Cipriano | |
| 7,713,785 B1 | 5/2010 | Flint | |
| 7,779,689 B2 | 8/2010 | Li et al. | |
| 7,814,791 B2 | 10/2010 | Andersson et al. | |
| 7,814,792 B2 | 10/2010 | Tateyama et al. | |
| 7,814,793 B2 | 10/2010 | Sato | |
| 7,861,422 B2 | 1/2011 | MacDonald | |
| 7,891,103 B2 | 2/2011 | Mayor | |
| 8,011,577 B2 | 9/2011 | Mullen et al. | |
| 8,016,191 B2 | 9/2011 | Bonalle et al. | |
| 8,037,758 B2 | 10/2011 | Sato | |
| 8,056,412 B2 | 11/2011 | Rutkiewicz et al. | |
| 8,061,049 B2 | 11/2011 | Mayor | |
| 8,087,296 B2 | 1/2012 | Ueda et al. | |
| 8,140,358 B1 | 3/2012 | Ling et al. | |
| 8,148,808 B2 | 4/2012 | Braden et al. | |
| 8,165,323 B2 | 4/2012 | Zhou | |
| 8,181,874 B1 | 5/2012 | Wan et al. | |
| 8,227,285 B1 | 7/2012 | Yang | |
| 8,236,577 B1 | 8/2012 | Hsu | |
| 8,245,923 B1 | 8/2012 | Merrill et al. | |
| 8,250,921 B2 | 8/2012 | Nasiri et al. | |
| 8,259,311 B2 | 9/2012 | Petschko | |
| 8,324,047 B1 | 12/2012 | Yang | |
| 8,342,021 B2 | 1/2013 | Oshio | |
| 8,367,522 B1 | 2/2013 | Yang | |
| 8,395,252 B1 | 3/2013 | Yang | |
| 8,395,381 B2 | 3/2013 | Lo | |
| 8,402,666 B1 | 3/2013 | Yang et al. | |
| 8,407,905 B1 | 4/2013 | Hsu et al. | |
| 8,421,082 B1 | 4/2013 | Yang | |
| 8,476,084 B1 | 7/2013 | Yang et al. | |
| 8,476,129 B1 | 7/2013 | Jensen et al. | |
| 8,477,473 B1 | 7/2013 | Koury et al. | |
| 8,486,723 B1 | 7/2013 | Wan et al. | |
| 2001/0053565 A1 | 12/2001 | Khoury | |
| 2002/0072163 A1 | 6/2002 | Wong et al. | |
| 2002/0134837 A1 | 9/2002 | Kishon | |
| 2003/0058069 A1 | 3/2003 | Schwartz et al. | |
| 2003/0095115 A1 | 5/2003 | Brian et al. | |
| 2003/0133489 A1 | 7/2003 | Hirota et al. | |
| 2003/0184189 A1 | 10/2003 | Sinclair | |
| 2003/0230802 A1 | 12/2003 | Poo et al. | |
| 2004/0002808 A1 | 1/2004 | Hashimoto et al. | |
| 2004/0016995 A1 | 1/2004 | Kuo et al. | |
| 2004/0017644 A1 | 1/2004 | Goodwin-Johansson | |
| 2004/0056742 A1 | 3/2004 | Dabbaj | |
| 2004/0063325 A1 | 4/2004 | Urano et al. | |
| 2004/0104268 A1 | 6/2004 | Bailey | |
| 2004/0113246 A1 | 6/2004 | Boon | |
| 2004/0119836 A1 | 6/2004 | Kitaguchi et al. | |
| 2004/0140962 A1 | 7/2004 | Wang et al. | |
| 2004/0177045 A1 | 9/2004 | Brown | |
| 2004/0207035 A1 | 10/2004 | Witcraft et al. | |
| 2004/0227201 A1 | 11/2004 | Ohta et al. | |
| 2005/0074147 A1 | 4/2005 | Smith et al. | |
| 2005/0090038 A1 | 4/2005 | Wallace | |
| 2005/0174338 A1 | 8/2005 | Ing | |
| 2005/0199791 A1 | 9/2005 | Sengoku et al. | |
| 2005/0247787 A1 | 11/2005 | Von Mueller et al. | |
| 2006/0049826 A1 | 3/2006 | Daneman et al. | |
| 2006/0081954 A1 | 4/2006 | Tondra et al. | |
| 2006/0141786 A1 | 6/2006 | Boezen et al. | |
| 2006/0168832 A1 | 8/2006 | Yasui et al. | |
| 2006/0192465 A1 | 8/2006 | Kornbluh et al. | |
| 2006/0208326 A1 | 9/2006 | Nasiri et al. | |
| 2006/0211044 A1 | 9/2006 | Green | |
| 2006/0238621 A1 | 10/2006 | Okubo et al. | |
| 2006/0243049 A1 | 11/2006 | Ohta et al. | |
| 2006/0274399 A1 | 12/2006 | Yang | |
| 2007/0046239 A1 | 3/2007 | Hashizume | |
| 2007/0132733 A1 | 6/2007 | Ram | |
| 2007/0152976 A1 | 7/2007 | Townsend et al. | |
| 2007/0181962 A1 | 8/2007 | Partridge et al. | |
| 2007/0200564 A1 | 8/2007 | Motz et al. | |
| 2007/0281379 A1 | 12/2007 | Stark et al. | |
| 2008/0014682 A1 | 1/2008 | Yang et al. | |
| 2008/0066547 A1 | 3/2008 | Tanaka et al. | |
| 2008/0110259 A1 | 5/2008 | Takeno | |
| 2008/0119000 A1 | 5/2008 | Yeh et al. | |
| 2008/0123242 A1 | 5/2008 | Zhou | |
| 2008/0210007 A1 | 9/2008 | Yamaji et al. | |
| 2008/0211043 A1 | 9/2008 | Chen | |
| 2008/0211113 A1 | 9/2008 | Chua et al. | |
| 2008/0211450 A1 | 9/2008 | Yamada et al. | |
| 2008/0277747 A1 | 11/2008 | Ahmad | |
| 2008/0283991 A1 | 11/2008 | Reinert | |
| 2009/0007661 A1 | 1/2009 | Nasiri et al. | |
| 2009/0015251 A1 | 1/2009 | Azumi et al. | |
| 2009/0049911 A1 | 2/2009 | Fukuda et al. | |
| 2009/0108440 A1 | 4/2009 | Meyer et al. | |
| 2009/0115412 A1 | 5/2009 | Fuse | |
| 2009/0153500 A1 | 6/2009 | Cho et al. | |
| 2009/0262074 A1 | 10/2009 | Nasiri et al. | |
| 2009/0267906 A1 | 10/2009 | Schroderus | |
| 2009/0307557 A1 | 12/2009 | Rao et al. | |
| 2009/0321510 A1 | 12/2009 | Day et al. | |
| 2010/0044121 A1 | 2/2010 | Simon et al. | |
| 2010/0045282 A1 | 2/2010 | Shibasaki et al. | |
| 2010/0071467 A1 | 3/2010 | Nasiri et al. | |
| 2010/0075481 A1* | 3/2010 | Yang | 438/458 |
| 2010/0083756 A1 | 4/2010 | Merz et al. | |
| 2010/0095769 A1 | 4/2010 | Matsumoto et al. | |
| 2010/0109102 A1 | 5/2010 | Chen et al. | |
| 2010/0171570 A1 | 7/2010 | Chandrahalim | |
| 2010/0208118 A1 | 8/2010 | Ueyama | |
| 2010/0236327 A1 | 9/2010 | Mao | |
| 2010/0248662 A1* | 9/2010 | Sheynblat et al. | 455/127.1 |
| 2010/0260388 A1* | 10/2010 | Garrett et al. | 382/124 |
| 2010/0302199 A1* | 12/2010 | Taylor et al. | 345/174 |
| 2010/0306117 A1 | 12/2010 | Terayoko | |
| 2010/0307016 A1 | 12/2010 | Mayor et al. | |
| 2010/0312519 A1 | 12/2010 | Huang et al. | |
| 2011/0131825 A1 | 6/2011 | Mayor et al. | |
| 2011/0146401 A1 | 6/2011 | Inaguma et al. | |
| 2011/0154905 A1 | 6/2011 | Hsu | |
| 2011/0172918 A1 | 7/2011 | Tome | |
| 2011/0183456 A1 | 7/2011 | Hsieh et al. | |
| 2011/0198395 A1 | 8/2011 | Chen | |
| 2011/0265574 A1 | 11/2011 | Yang | |
| 2011/0266340 A9 | 11/2011 | Block et al. | |
| 2011/0312349 A1 | 12/2011 | Forutanpour et al. | |

(56) References Cited

U.S. PATENT DOCUMENTS

2012/0007597 A1    1/2012    Seeger et al.
2012/0007598 A1*  1/2012    Lo et al. .................. 324/252
2012/0215475 A1    8/2012    Rutledge et al.

OTHER PUBLICATIONS

Non-Final Office Action for U.S. Appl. No. 12/940,023, mailed on Oct. 26, 2011, 5 pages.
Notice of Allowance for U.S. Appl. No. 12/940,020, mailed on Jan. 13, 2012, 9 pages.
Requirement for Restriction/Election for U.S. Appl. No. 12/717,070, mailed on Dec. 2, 2011, 5 pages.
Notice of Allowance for U.S. Appl. No. 12/717,070 mailed on Mar. 9 2012, 9 pages.
U.S. Appl. No. 12/913,440, Final Office Action mailed Oct. 10, 2013, 10 pages.
U.S. Appl. No. 12/944,712 Final Office Action mailed Aug. 21, 2013, 15 pages.
U.S. Appl. No. 12/983,309 Notice of Allowance mailed Aug. 13, 2013, 11 pages.
U.S. Appl. No. 13/924,457 Notice of Allowance mailed Sep. 18, 2013, 11 pages.
U.S. Appl. No. 13/035,968 Non-Final Office Action mailed Jul. 31, 2013, 8 pages.
U.S. Appl. No. 13/035,969 Non-Final Office Action mailed Oct. 25, 2013, 11 pages.
U.S. Appl. No. 13/751,014 Notice of Allowance mailed Jul. 31, 2013, 9 pages.
U.S. Appl. No. 12/787,368 Non-Final Office Action mailed Sep. 19, 2013, 19 pages.
U.S. Appl. No. 13/922,983 Notice of Allowance mailed Oct. 7, 2013, 10 pages.
U.S. Appl. No. 12/787,200 Notice of Allowance mailed Sep. 26, 2013, 11 pages.
U.S. Appl. No. 13/177,053 Non-Final Office Action mailed Sep. 18, 2013, 12 pages.
U.S. Appl. No. 13/164,311 Notice of Allowance mailed Sep. 17, 2013, 8 pages.
U.S. Appl. No. 13/163,672 Non-Final Office Action mailed Sep. 5, 2013, 7 pages.
U.S. Appl. No. 12/940,025 Notice of Allowance mailed Oct. 17, 2013, 10 pages.
U.S. Appl. No. 13/069,355 Final Office Action mailed Oct. 31, 2013, 15 pages.

* cited by examiner

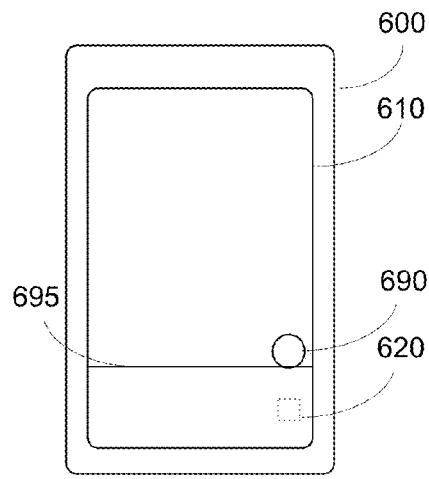
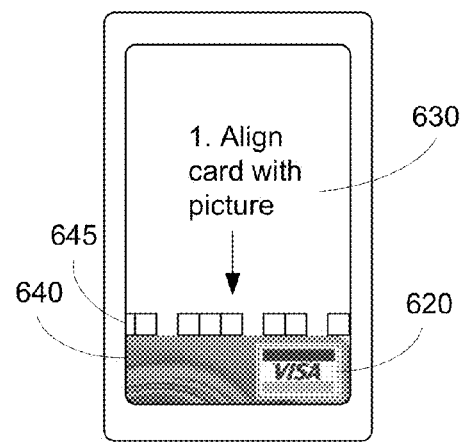
FIG. 4A                FIG. 4B
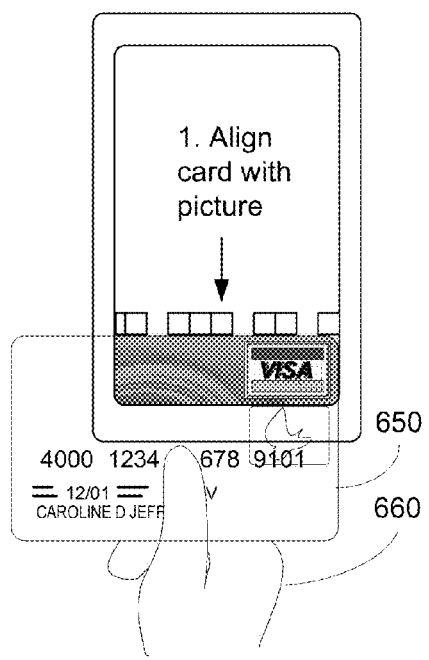
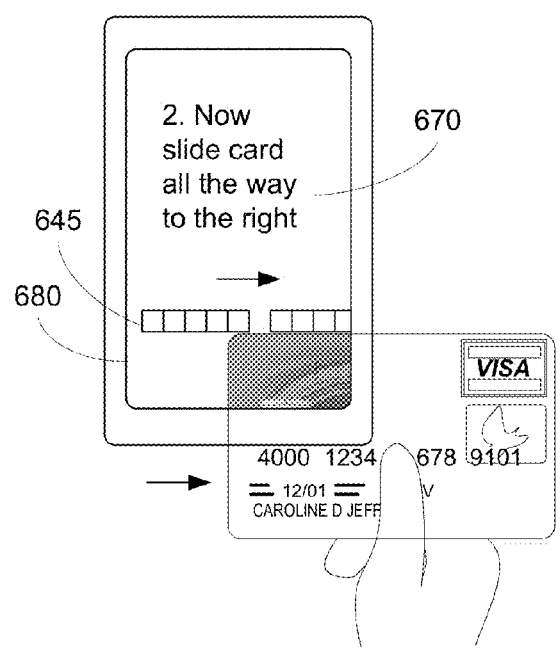
FIG. 4C                FIG. 4D

METHODS AND APPARATUS FOR OBJECT TRACKING ON A HAND-HELD DEVICE

CROSS-REFERENCE TO RELATED APPLICATIONS

The present application relates to and incorporates by reference, for all purposes, the following pending patent applications: U.S. patent application Ser. No. 12/490,067, filed Jun. 23, 2009, and U.S. patent application Ser. No. 12/717,070, filed Mar. 3, 2009, U.S. patent application Ser. No. 12/787,368, filed May 25, 2010. The present invention also incorporates by reference, for all purposes, the following pending patent applications related to magnetic field sensors: U.S. patent application Ser. No. 12/859,631, filed Aug. 19, 2010, U.S. Pat. App. No. 61/347,805, filed May 24, 2010, and U.S. Pat. App. No. 61/348,387, filed May 26, 2010.

BACKGROUND OF THE INVENTION

Embodiments of the present invention relate to touch screen devices. More specifically, the present invention relates to touch screen devices capable of sensing the force of a touch and methods of use thereof.

The use of touch screen devices and touch user interfaces are now quite common place for consumers: from the signature machine in the checkout isle, to automatic teller machines at banks, to ticketing kiosks at airports, and the like. Touch screen capability is also now quite common in hand-held devices: from the Palm Pilot, to the Google Nexus One, to the Apple iPad, and the like.

Touch capability has typically been enabled for many touch screen devices through the incorporation and use of a resistive sensor network. These sensor networks can sense when a single finger of the user touches the display, or when the user uses a stylus to touch the display.

Drawbacks to touch screen devices incorporating resistive-based sensors, determined by the inventor, include that if a user inadvertently touches two locations on the touch screen at the same time, the location reported by the touch screen is often incorrect. As such devices typically only support detecting one finger at a time, for example, if two fingers touch the screen, the reported touch location may be between the two fingers. Another drawback includes that the user has to press down with some force on the touch screen before the touch screen can detect the user touch.

Newer capacitive-based touch screen displays are now more commonly used and address some of the short comings of a resistive-based sensor network. As an example, capacitive-based touch screens can sense the individual locations of fingers when the user touch the display with more than one finger. Accordingly, these devices are often termed "multi-touch" displays. As another example, capacitive-based touch screens do not require the user to press-down upon the touch screen before the finger is sensed.

Drawbacks to the use of capacitive-based touch screens, determined by the inventor, include that even if a user inadvertently brushes her finger across the touch screen, that accidental swipe may still be sensed as a user input. This is particularly frustrating, for example, when a user is trying to touch-type using a virtual keyboard to input text. In such cases, as the user hovers his fingers over the home row of the virtual keyboard, often his little finger, middle finger, or the like may accidentally touch the surface of the display. These touches are then incorrectly sensed as presses of the virtual keys causing typographical errors.

Although many touch screen devices include automatic spelling/prediction software to attempt to reduce the effect of typographic errors, in many instances the predicted word is not the word the user wants. Accordingly, the user must constantly watch the touch screen display to monitor the automatic predictions and to select the correct word. These types of interruptions greatly interfere with the text-entry efficiency provided by the user's ability to touch-type.

Additional drawbacks determined by the inventor of resistive and capacitive based touch screen include that the sensed touches are typically binary in nature, i.e. either the finger is not touching or the finger is touching. These types of devices cannot sense the force with which a user touches the touch screen display. From a user point of view, these touch screen devices also do not provide a user with any sensation of pressing a button or key, i.e. they provide no tactile feedback.

One type of touch screen display used by Research In Motion (RIM) to provide the user with tactile feedback was used in the Blackberry Storm series of devices. In these products, one or more micro sensors were placed under the capacitive-based touch screen display. In operation, when the user wanted to make an on-screen selection, the user would press the touch screen display. The touch screen display would then deflect (by about a millimeter) and cause one of the micro sensors to physically click or switch. The physical click would thus provide the user with tactile confirmation of the button press.

Drawbacks to such approaches, determined by the inventor, include that such devices were limited to the physical performance of the micro sensors. For example, a user could not type very quickly with such an approach because the user had to pause between key presses to wait until the micro sensors could fully reset before she could press the next key. Further, if the user placed two or more fingers on the touch screen at the same time she depressed the touch screen (activating the micro sensor(s)), it would be unclear which touch screen location or finger the user intended.

The inventor of the present application has also noticed that with advances in graphical user interfaces, capacitive touch displays, high resolution displays, high contrast displays, and the like, much emphasis has been put upon the user interacting with the display. In contrast, previously, a number of physical buttons were provided upon devices such as a portable telephone, a PDA, or the like. When the user pressed the physical buttons, one of a number of actions occurred, such as launching an application, making a telephone call, taking a picture, or the like.

Drawbacks to having physical buttons for such devices included that it increased manufacturing and assembly costs, increased the number of components and complexity of the devices, increased the number of potential faulty components (e.g. broken switch, dust), and the like. Other drawbacks included that physical buttons are now often deemed to be undesirable as they decrease the aesthetics of such devices. In light of the above, recent popular devices have a reduced number of physical buttons.

Drawbacks to concentrating upon virtual (soft) buttons on a display, determined by the inventor, include that such devices greatly increase the requirements that the user view a display and that the user must interact with that display to perform basic functions. As merely an example, with popular devices, it is now virtually impossible for a user to enter a telephone number without requiring a user to look at the display. As another example, it is now common for a user to press a virtual button displayed on a display to initiate taking a photograph, whereas previously a physical button was provided.

From the above, it is desired to have a device with user input capability without the drawbacks described above.

BRIEF SUMMARY OF THE INVENTION

Embodiments of the present invention relate to touch screen devices. More specifically, the present invention relates to touch screen devices capable of sensing the force of a touch and methods of use thereof.

Various embodiments of the present invention disclose a computer system such as a cell phone, internet access device, media player, or the like having a touch screen display and one or more physical sensors. In operation, when a user touches a location on the touch screen display, the function associated with the touched location is determined. The function may be running of an application program, selection of a function within an application program, and the like. In various embodiments, a type and/or magnitude of movement is determined by the one or more physical sensors also in response to the user touching the touch screen display. Based upon the type and/or magnitude of movement or combinations of movements, an input parameter or value may be determined for use by the selected function. Next, the function is initiated and given the input parameter or value.

Other embodiments of the present invention disclose a computer system such as a tablet computer, a smart phone, cell phone, or the like also having a display (e.g. touch screen) and one or more physical sensors. In operation, when a user touches a location on the touch screen display, the function associated with the touched location is again determined. The function may be running of an application program, selection of a function within an application program, and the like. In various embodiments, a type and/or magnitude of movement is determined by the one or more physical sensors also in response to the user touching the touch screen display. The type and/or magnitude of movement is then compared to one or more thresholds for type and/or magnitude of movement. In various embodiments, if the threshold is not exceeded, the function is inhibited, and when the threshold is exceeded (e.g. enough physical impulse), the function is performed.

Other embodiments of the present invention disclose a computer system such as a tablet computer, a smart phone, cell phone, or the like also having a touch screen display and one or more physical sensors. In operation, when a user physically perturbs the computer system, the perturbation will cause the computer system to perform a user-desired action. The perturbation may be a change in physical position or angular orientation of the computer system, a change in air pressure, a change in sensed magnetic field, or the like. Merely as examples, a user tapping upon a case of the computer system (device) (or a surface upon which the computer system is laying upon or may cause the computer system to take a picture; start or stop a timer; answer or disconnect a telephone call; invoke an application (e.g. knock-knocking on a computer system to invoke a VOIP application, a chat application, an IM, or the like); or the like. As other examples, a user positioning a credit card magnetic strip near the computer system may invoke a payment application and/or may cause the computer system to sense the data encoded on the magnetic strip; a sudden change in magnetic field may cause the computer system to shut down; a constant or sudden change in air pressure may invoke a pressure monitoring program (e.g. a scuba diving log application, a weather application); may cause the computer system to disconnect wireless transceivers and enter an "airplane mode;" or the like.

According to one aspect of the invention, a handheld device is described. One apparatus includes a housing and a display. A device may include a MEMS magnetic field sensor disposed within the housing, wherein the MEMS magnetic field sensor is configured to sense a plurality of perturbations in magnetic fields in response to a perturbation source when the user displaces the perturbation source proximate to the handheld device. A system may include a processor disposed within the housing and coupled to the MEMS magnetic field sensor and to the display, wherein the processor is programmed to receive the plurality of perturbations in magnetic fields, wherein the processor is programmed to determine a plurality of spatial locations in at least two-dimensions in response to the plurality of perturbations, and wherein the processor is programmed output an indication of the plurality of spatial locations on the display.

According to another aspect of the invention, a computer implemented method for a handheld computer system for determining a location of a perturbation source is disclosed. One technique includes sensing in a MEMS magnetic field sensor disposed within the handheld computer system, a plurality of perturbations in magnetic fields in response to a user spatially displacing the perturbation source relative to the handheld device. A process may include determining in a processor, a plurality of spatial locations in at least two-dimensions in response to the plurality of perturbations in the magnetic fields, and displaying on a display, an indication of the plurality of spatial locations.

Various additional objects, features and advantages of the present invention can be more fully appreciated with reference to the detailed description and accompanying drawings that follow.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIGS. 4C-D illustrate a process according to various embodiments of the present invention;

DETAILED DESCRIPTION OF THE INVENTION

Figure 1:
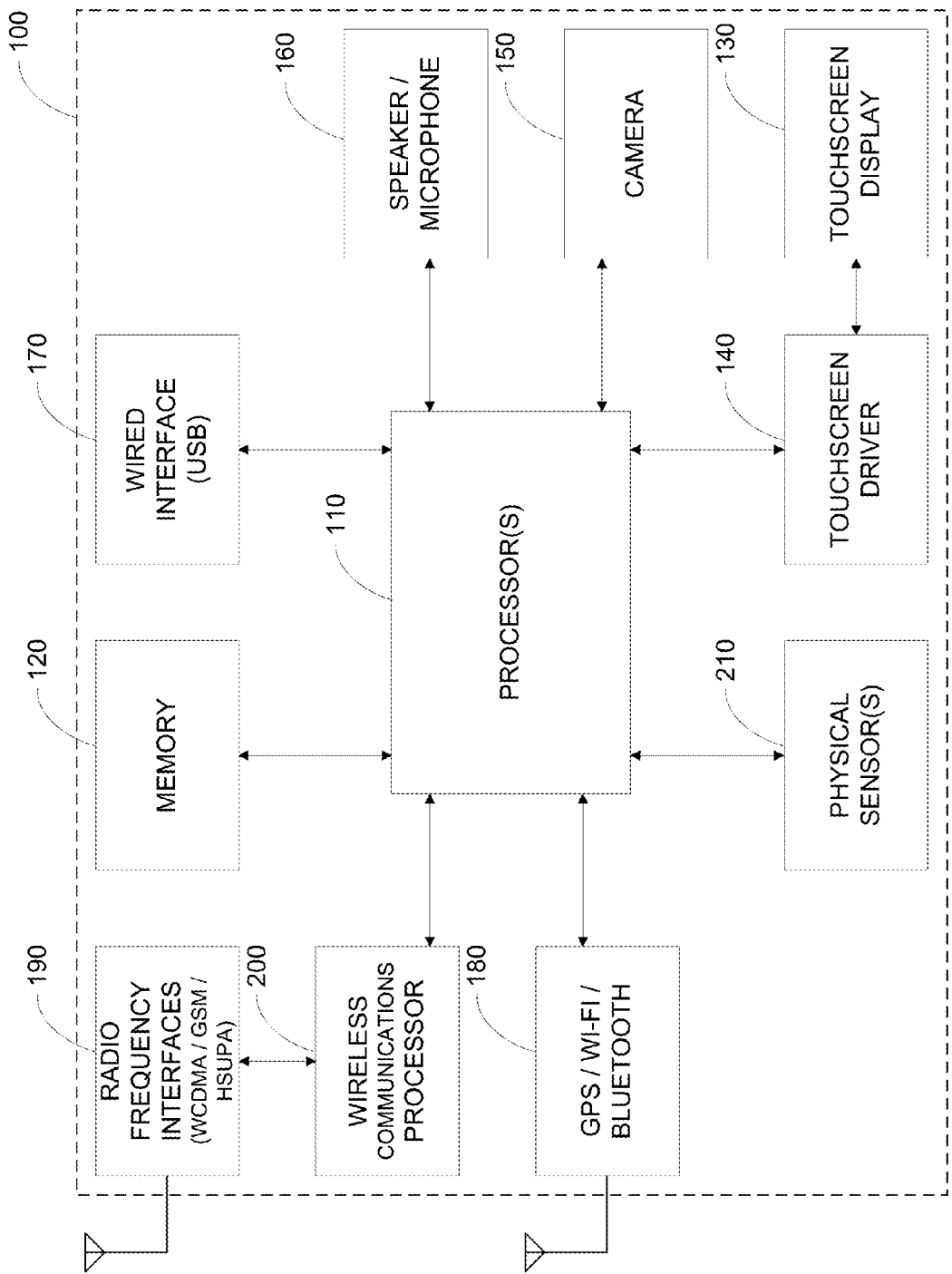
FIG. 1 illustrates a functional block diagram of various embodiments of the present invention.

FIG. 1 illustrates a functional block diagram of various embodiments of the present invention. In FIG. 1, a computing device 100 typically includes an applications processor 110, memory 120, a touch screen display 130 and driver 140, an image acquisition device 150, audio input/output devices 160, and the like. Additional communications from and to computing device are typically provided by via a wired interface 170, a GPS/Wi-Fi/Bluetooth interface 180, RF interfaces 190 and driver 200, and the like. Also included in various embodiments are physical sensors 210.

In various embodiments, computing device 100 may be a hand-held computing device (e.g. Apple iPad, Apple iTouch, Dell Mini slate, Lenovo Skylight/IdeaPad, Asus EEE series, Microsoft Courier, Notion Ink Genesis, Samsung Galaxy Tab,), a portable telephone (e.g. Apple iPhone, Motorola Droid, Droid X, Google Nexus One, HTC Incredible/EVO 4G, Palm Pre series, Nokia N900), a portable computer (e.g. netbook, laptop), a media player (e.g. Microsoft Zune, Apple iPod), a reading device (e.g. Amazon Kindle, Barnes and Noble Nook), or the like.

Typically, computing device 100 may include one or more processors 110. Such processors 110 may also be termed application processors, and may include a processor core, a video/graphics core, and other cores. Processors 110 may be a processor from Apple (A4), Intel (Atom), NVidia (Tegra 2), Marvell (Armada), Qualcomm (Snapdragon), Samsung, TI (OMAP), or the like. In various embodiments, the processor core may be an Intel processor, an ARM Holdings processor such as the Cortex-A, -M, -R or ARM series processors, or the like. Further, in various embodiments, the video/graphics core may be an Imagination Technologies processor PowerVR-SGX, -MBX, -VGX graphics, an Nvidia graphics processor (e.g. GeForce), or the like. Other processing capability may include audio processors, interface controllers, and the like. It is contemplated that other existing and/or later-developed processors may be used in various embodiments of the present invention.

In various embodiments, memory 120 may include different types of memory (including memory controllers), such as flash memory (e.g. NOR, NAND), pseudo SRAM, DDR SDRAM, or the like. Memory 120 may be fixed within computing device 100 or removable (e.g. SD, SDHC, MMC, MINI SD, MICRO SD, CF, SIM). The above are examples of computer readable tangible media that may be used to store embodiments of the present invention, such as computer-executable software code (e.g. firmware, application programs), application data, operating system data or the like. It is contemplated that other existing and/or later-developed memory and memory technology may be used in various embodiments of the present invention.

In various embodiments, touch screen display 130 and driver 140 may be based upon a variety of later-developed or current touch screen technology including resistive displays, capacitive displays, optical sensor displays, electromagnetic resonance, or the like. Additionally, touch screen display 130 may include single touch or multiple-touch sensing capability. Any later-developed or conventional output display technology may be used for the output display, such as TFT-LCD, OLED, Plasma, trans-reflective (Pixel Qi), electronic ink (e.g. electrophoretic, electrowetting, interferometric modulating). In various embodiments, the resolution of such displays and the resolution of such touch sensors may be set based upon engineering or non-engineering factors (e.g. sales, marketing). In some embodiments of the present invention, a display output port, such as an HDMI-based port or DVI-based port may also be included.

In some embodiments of the present invention, image capture device 150 may include a sensor, driver, lens and the like. The sensor may be based upon any later-developed or convention sensor technology, such as CMOS, CCD, or the like. In various embodiments of the present invention, image recognition software programs are provided to process the image data. For example, such software may provide functionality such as: facial recognition, head tracking, camera parameter control, or the like.

In various embodiments, audio input/output 160 may include conventional microphone(s)/speakers. In some embodiments of the present invention, three-wire or four-wire audio connector ports are included to enable the user to use an external audio device such as external speakers, headphones or combination headphone/microphones. In various embodiments, voice processing and/or recognition software may be provided to applications processor 110 to enable the user to operate computing device 100 by stating voice commands. Additionally, a speech engine may be provided in various embodiments to enable computing device 100 to provide audio status messages, audio response messages, or the like.

In various embodiments, wired interface 170 may be used to provide data transfers between computing device 100 and an external source, such as a computer, a remote server, a storage network, another computing device 100, or the like. Such data may include application data, operating system data, firmware, or the like. Embodiments may include any later-developed or conventional physical interface/protocol, such as: USB 2.0, 3.0, micro USB, mini USB, Firewire, Apple iPod connector, Ethernet, POTS, or the like. Additionally, software that enables communications over such networks is typically provided.

In various embodiments, a wireless interface 180 may also be provided to provide wireless data transfers between computing device 100 and external sources, such as computers, storage networks, headphones, microphones, cameras, or the like. As illustrated in FIG. 1, wireless protocols may include Wi-Fi (e.g. IEEE 802.11 a/b/g/n, WiMax), Bluetooth, IR and the like.

GPS receiving capability may also be included in various embodiments of the present invention, however is not required. As illustrated in FIG. 1, GPS functionality is included as part of wireless interface 180 merely for sake of convenience, although in implementation, such functionality is currently performed by circuitry that is distinct from the Wi-Fi circuitry and distinct from the Bluetooth circuitry.

Additional wireless communications may be provided via RF interfaces 190 and drivers 200 in various embodiments. In various embodiments, RF interfaces 190 may support any future-developed or conventional radio frequency communications protocol, such as CDMA-based protocols (e.g. WCDMA), GSM-based protocols, HSUPA-based protocols, or the like. In the embodiments illustrated, driver 200 is illustrated as being distinct from applications processor 110. However, in some embodiments, these functionality are provided upon a single IC package, for example the Marvel PXA330 processor, and the like. It is contemplated that some embodiments of computing device 100 need not include the RF functionality provided by RF interface 190 and driver 200.

FIG. 1 also illustrates computing device 100 to include physical sensors 210. In various embodiments of the present invention, physical sensors 210 are multi-axis Micro-Electro-Mechanical Systems (MEMS) based devices being developed by M-cube, the assignee of the present patent application. Physical sensors 210 developed by M-cube currently include very low power three-axis sensors (linear, gyro or magnetic); ultra-low jitter three-axis sensors (linear, gyro or magnetic); low cost six-axis motion sensor (combination of linear, gyro, and/or magnetic); ten-axis sensors (linear, gyro, magnetic, pressure); and various combinations thereof. As described in the patent applications referenced above, various embodiments of physical sensors 210 are manufactured using a foundry-compatible process. As explained in such applications, because the process for manufacturing such physical sensors can be performed on a standard CMOS fabrication facility, it is expected that there will be a broader adoption of such components into computing device 100. In other embodiments of the present invention, conventional physical sensors 210 from Bosch, STMicroelectronics, Analog Devices, Kionix or the like may be used.

In various embodiments, any number of future developed or current operating systems may be supported, such as iPhone OS (e.g. iOS), WindowsMobile (e.g. 7), Google Android (e.g. 2.2), Symbian, or the like. In various embodiments of the present invention, the operating system may be a multi-threaded multi-tasking operating system. Accordingly, inputs and/or outputs from and to touch screen display 130 and driver 140 and inputs/or outputs to physical sensors 210 may be processed in parallel processing threads. In other embodiments, such events or outputs may be processed serially, or the like. Inputs and outputs from other functional blocks may also be processed in parallel or serially, in other embodiments of the present invention, such as image acquisition device 150 and physical sensors 210.

FIG. 1 is representative of one computing device 100 capable of embodying the present invention. It will be readily apparent to one of ordinary skill in the art that many other hardware and software configurations are suitable for use with the present invention. Embodiments of the present invention may include at least some but need not include all of the functional blocks illustrated in FIG. 1. For example, in various embodiments, computing device 100 may lack image acquisition unit 150, or RF interface 190 and/or driver 200, or GPS capability, or the like. Additional functions may also be added to various embodiments of computing device 100, such as a physical keyboard, an additional image acquisition device, a trackball or trackpad, a joystick, or the like. Further, it should be understood that multiple functional blocks may be embodied into a single physical package or device, and various functional blocks may be divided and be performed among separate physical packages or devices.

FIGS. 2A-D illustrate block diagrams of flow processes according to various embodiments of the present invention. For illustrative purposes only, reference to elements in FIG. 1 are provided in the discussion below merely for the sake of convenience.

In various embodiments of the present invention, physical sensors 210 are provided as part of a computing device 100, step 300. For example, physical sensors 210 provided by the assignee of the present patent application are provided to an assembly entity to form computing device 100. Computing device 100 is then assembled, step 310 and provided for the user, step 320. As described above, in various embodiments, computing device 100 may be a cell-phone, internet access device, a tablet computer, a personal media player/viewer, or the like running an appropriate operating system.

In ordinary use of such a device, computing device 100 (via the operating system) may display any number of graphical user interfaces including user-selectable regions on touch screen display 130, step 320. These user-selectable regions may include radio buttons, sliders, selection buttons, text entry regions and the like. Further, these soft buttons may be associated with application software functions, operating system functions, data management functions, telephony functions, audio processing functions, image processing functions, or the like.

Subsequently, the user determines a function they wish computing device 100 to perform after viewing the graphical user interface, step 340. In various embodiments, the user then touches or contacts a portion of touch screen display 130 corresponding to the user-selectable region, step 350.

Next, in various embodiments of the present invention, the following processes can be performed in parallel by different processing threads, serially by one or more processes, or independently in separate processing threads.

Figure 2A:
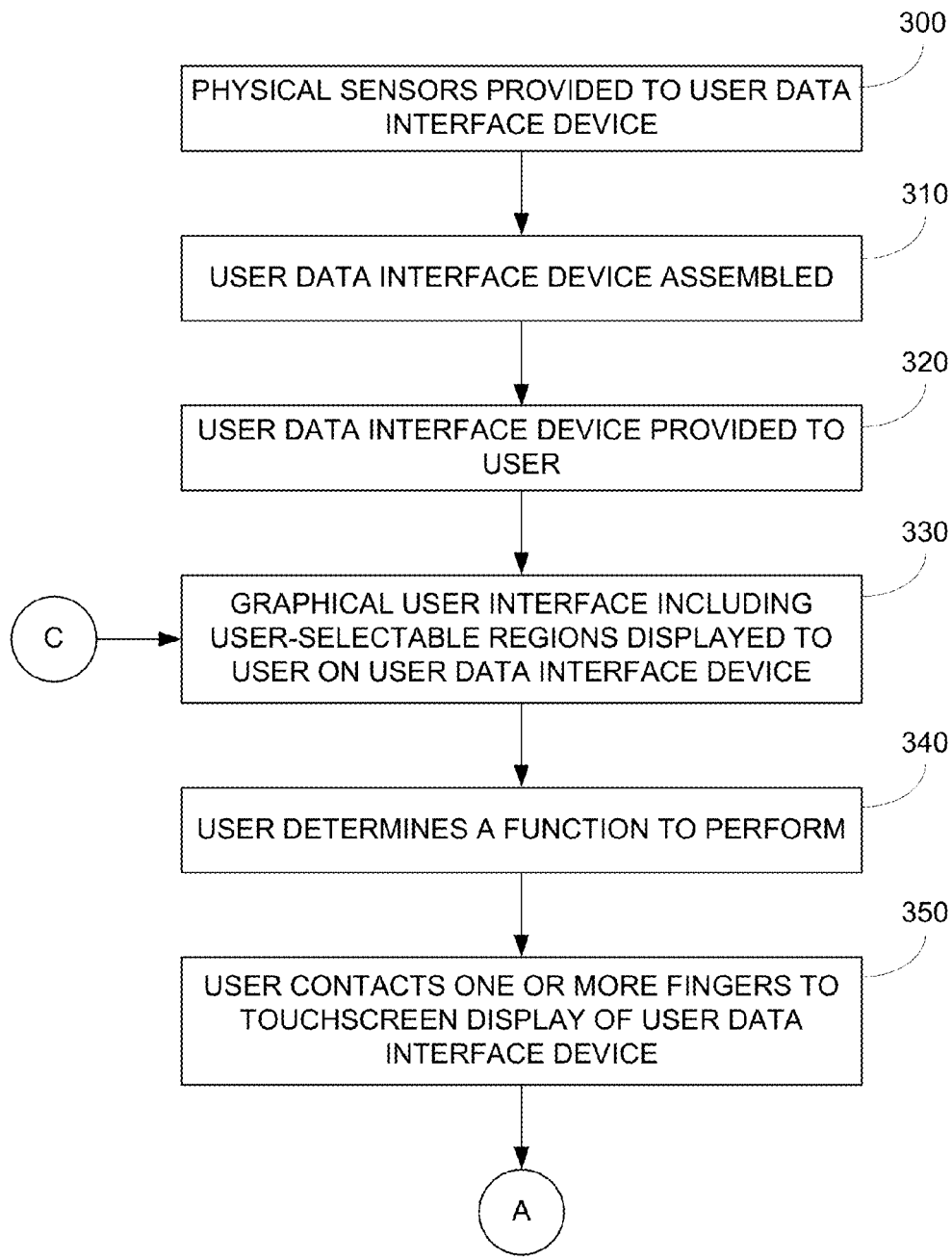
FIGS. 2A-D illustrate block diagrams of flow processes according to various embodiments of the present invention.
Figure 2B:
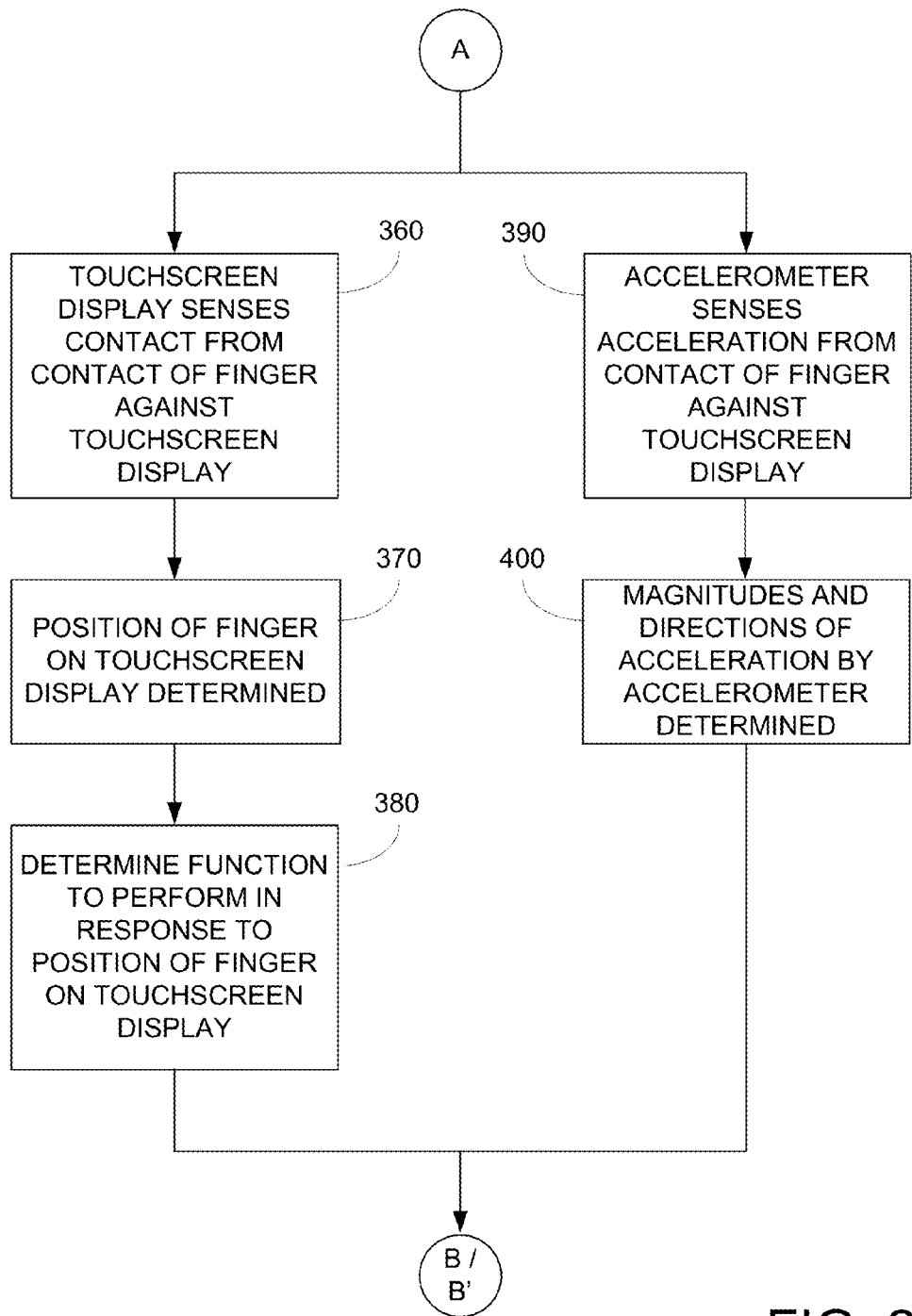

In FIG. 2B, touch screen display 130 senses the user contact in step 360. As described above, in various embodiments, touch screen display 130 may perform this function via the use of resistive sensors, capacitive sensors, or the like. In response to the physical sensor data, the user-selectable region within the GUI is determined, step 370. Next, in various embodiments, computing device 100 then determines one or more functions associated with the user-selectable region, step 380.

In various embodiments of the present invention, it is contemplated that when a user contacts her finger on touch screen display 130 in step 350, computing device 100 (physical sensors 210) will be physically perturbed, step 390. For example, when the user touches touch screen display 130, computing device 100 (physical sensors 210) will be subject to a force (e.g. a change in sensed physical state, a physical perturbation). In various embodiments, this physical change causes physical sensors 210 to sense a change in spatial location (sensed by an accelerometer), causes physical sensors 210 to sense a change its tilt or orientation (sensed by a gyroscope), or the like. For sake of convenience, FIG. 2A merely references use of an accelerometer. In other embodiments, this change causes physical sensors 210 to sense a change in a magnetic field, sense a change in GPS coordinates, sense a change in temperature or air pressure, or the like.

Next, in various embodiments in response to the perturbations of the computing device 100/physical sensors 210, magnitudes and/or directions of the changes are determined in step 400. As described in the above-referenced patent applications, the CMOS foundry-compatible MEMS physical sensor embodiments of the present invention provide a higher level of sensitivity and lower level of noise for such measurements than is currently available.

Figure 2C:
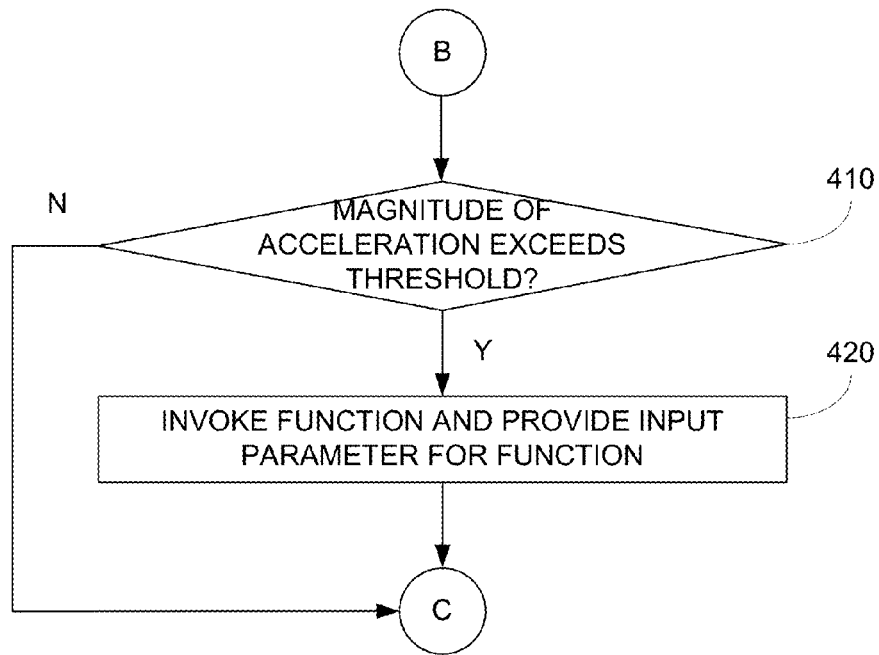
Figure 2D:
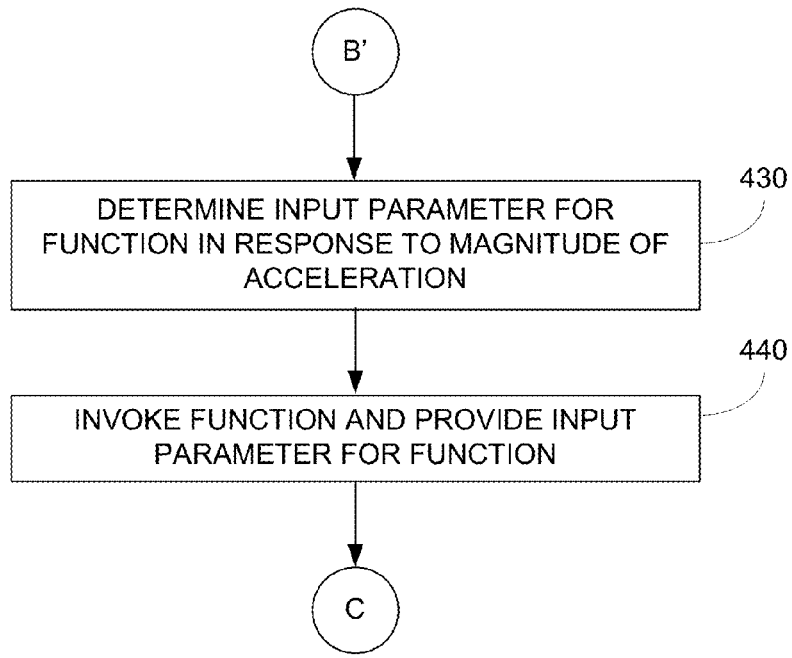

In various embodiments of the present invention, the process may then proceed to FIG. 2C or 2D.

In the example illustrated in FIG. 2C, a determination is then made as to whether the type, magnitude and/or direction of the sensed physical perturbations exceed a predetermined threshold, step 410. In various embodiments, the type of sensed perturbations and the threshold may be predetermined by the operating system, may be set by the user during, for example, a setup phase, may be specified by the application of function or the like.

As various examples, the threshold may be an acceleration in a −z-direction (away from a touch screen display) of 0.1 g, an acceleration in a −z-direction of 0.05 g followed by an acceleration in the +z-direction of 0.03 g; an acceleration of 0.1 g in the −z-direction and accelerations of 0.03 g in the x and y directions; a tilt of 0.5 degrees in a first axis rotation at the same time as a tilt of 1 degree in a second axis of rotation; a tilt of 0.2 degrees in a first axis followed by a tilt of −0.3 degrees in the first axis; a increase in magnetic field by 10 gauss; an increase in atmospheric pressure of 10 mm Hg for 0.25 seconds; and the like. In light of the present patent disclosure, one of ordinary skill in the art will recognize many different thresholds based upon permutations of acceleration, tilts, magnetic fields, pressure, GPS coordinates, time, and the like, that are within the scope of embodiments of the present invention.

In various embodiments, if the threshold is exceeded, the function determined in step 380 is performed, step 420; if not, the process returns to step 330. Embodiments may be applied to any number of different functions, for example, a virtual telephone keypad. In typical situations, a user may inadvertently make a telephone call when the cell phone is in his pocket and he reaches for his keys. As his fingers brush against the virtual keypad, the telephone may interpret these as user selections for a telephone number to call. In various embodiments, inadvertent calls may be avoided if it is required that the physical sensors detect an acceleration (e.g. 0.1 g) primarily in the −z direction at about the same time the user touches the virtual keyboard keys. When in his pocket, when the fingers brush or knock against the key pad, the physical sensors may detect an acceleration of 0.05 g in the −z direction, 0.02 in the x direction and 0.05 in the y direction, then, the user touch may be ignored. Accordingly, the execution of unintended user functions on a computing device may be reduced.

In additional embodiments of the present invention, the process of FIG. 2B may proceed to FIG. 2D. In these embodiments a determination is then made as to a value for an input parameter based upon the type, magnitude and/or direction of the sensed physical perturbations, step 430. In various embodiments, a relationship between the type of sensed perturbations and the input parameter may be predetermined by the operating system, may be set by the user during, for example, a setup phase, may be specified by the application of function or the like.

Similar to the embodiment illustrated in FIG. 2C, a number of different thresholds may be used and mapped to different values for the input parameter. In various examples, an acceleration in a −z-direction (away from a touch screen display) of 0.1 g may map to an input value of "1," 0.2 g may map to "2," 0.3 g may map to "3," or the like; an acceleration in only a −z direction of 0.01 g may map to an input value of "256," an acceleration of 0.01 g in the −z direction and 0.05 g in the x-direction may map to an input value of "512;" a clockwise roll of 0.1 degrees may map to an input value of "increase," a counter clock-wise roll of 0.1 degrees may map to an input value of "decrease," or the like.

In response to the value for the input parameter determined, in step 440, the function may be performed using this value. Embodiments may be applied to any number of different functions, for example, a painting program. In such cases, a harder tap may be associated with a larger paint spot upon a canvas, a softer tap may be associated with a smaller spot upon a canvas, and the like. In other embodiments, other types of parameters may also be adjusted based upon sensed physical change such as: position of graphic elements, brightness, contrast, gamma, sharpness, saturation, filter, and the like. As another example, a flick of a finger at a first velocity with a low impact may be associated moving a series of images at a slower rate, a flick of a finger at the first velocity with a higher impact may be associated moving a series of images at a faster rate. In other embodiments, other types of parameters may also be adjusted, such as: rate of acceleration, rate of rotation, rate of zoom, rate of pan, and the like. As another example, the type or magnitude of sensed physical change may control a volume level, a microphone sensitivity level, a bass level, a treble level, or the like. Accordingly, the execution of user functions may have different input parameters of values based upon sensed physical changes.

Figure 3:
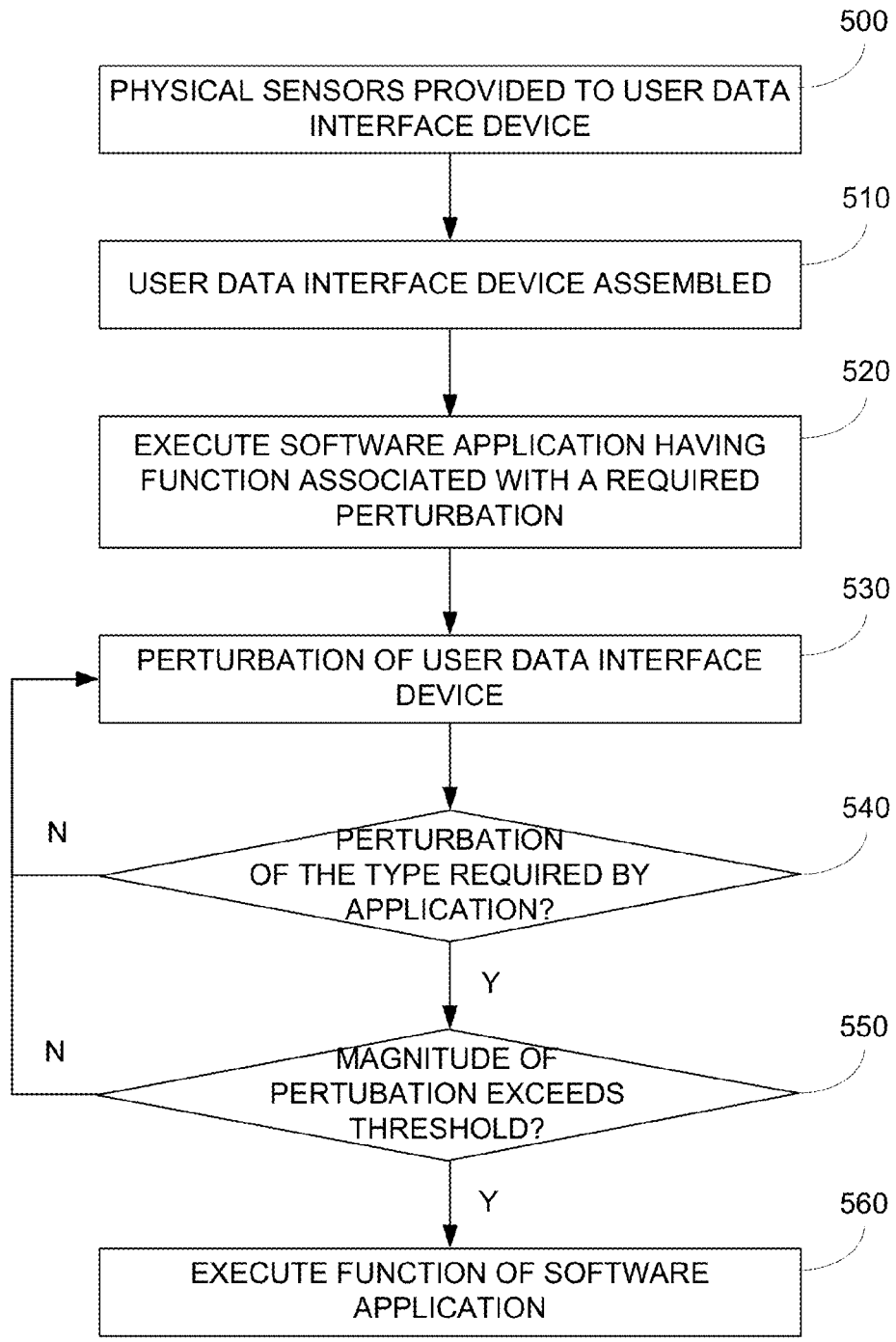
FIG. 3 illustrates a block diagram of flow processes according to various embodiments of the present invention.

FIG. 3 illustrates a block diagram of flow processes according to various embodiments of the present invention. For illustrative purposes only, reference to elements in FIG. 1 may be provided in the discussion below merely for the sake of convenience.

In various embodiments of the present invention, physical sensors 210 are provided as part of a computing device 100, step 500. For example, physical sensors 210 developed by the assignee of the present patent application are provided to an assembly entity to form computing device 100. Computing device 100 is then assembled, step 510 and provided for the user, step 320. As described above, in various embodiments, computing device 100 may be a cell-phone, internet access device, a tablet computer, a personal media player/viewer, or the like running an appropriate operating system along with software applications. These steps may be performed at device manufacturing time whereas the following steps may be performed by a user of the device, or the like.

Next, a user may run or execute a software application upon computing device 100, step 520. In various embodiments, the software application may be an operating system, a program, or the like. In such software, a user input or triggering event is required to invoke a function on computing device 100. As merely an example, a function may be taking a picture, answering or terminating a phone call; initiating a VOIP application, chat program, IM, or the like; initiating a data logging program; or the like. In various embodiments, the user may be prompted to perturb computing device 100 to invoke the function. For example, an output audio message may prompt the user, such as, "tap the phone anywhere to take a picture;" a display image may prompt the user, such as a sequential display of lights in a drag strip "Christmas tree" sequence; and the like.

In various embodiments, computing device 100 is perturbed, step 530. In some examples, the user may directly perturb computing device 100, for example, the user may physically displace, accelerate, rotate and/or move computing device 100 itself (e.g. tapping on the interface device); the user may perturb computing device 100 indirectly (e.g. tapping on a table upon which the interface device is resting); or the like. In other examples, the user may indirectly cause the perturbation, for example, a computing device 100 and a magnetic source are moved towards or away from each other, the air pressure may decrease as the user flies in an airplane or as the weather changes, or the like.

In various embodiments, a type and magnitude of the perturbation are determined by the respective sensors, typically in parallel. For example, an acceleration in the x, y or z axis may be determined by x, y, and z axis accelerometers, a tilt, pan, or roll may be determined by x, y and z rotation sensors, a change in pressure may be determined by a pressure sensor, a change in magnetic field in may be determined in x, y and z axis by separate magnetic sensors, and the like. As discussed above, various embodiments of the present invention may be embodied as a three-axis, six-axis, nine-axis, ten-axis or the like MEMS device currently being developed by the assignee of the present patent application.

In response to the perturbations, computing device 100 determines whether the perturbation are of the type expected/required by the software application, step 540. For example, if computing device 100 is expecting an acceleration in the z-axis, a change is magnetic field may not be deemed to be the proper type of perturbation; if computing device 100 is expecting a change in GPS coordinates, a rotation may not be deemed to be the proper type of perturbation, or the like. In various embodiments, if the perturbation is the desired type, the process continues in step 550, otherwise, the perturbation may be ignored.

In some embodiments of the present invention, the magnitudes of the perturbations may be compared to one or more thresholds, step 550. This step is similar to that described in step 410, above. More specifically, in various embodiments, it may be desirable that the magnitudes of the perturbations be sufficient to reduce the chance of accidental or unintended user input. For example, in one application, a user can knock upon a table to answer call on a cell phone resting upon the table. In such an application, it may be desirable that a firm knock be sensed, before the phone is answered, otherwise, mere shuffling of papers may cause the call to be answered. As other examples, in some embodiments, a change in sensed magnetic field may be small enough to be considered merely noise, thus such changes may be ignored; a change in sensed pressure differential may be too small to be considered a valid pressure differential; or the like.

As another example, in one application, a user taps on the surface of a hand held device (e.g. edge, back plate, etc.) to have the hand held device take a picture. In such an application, without such a threshold, as the user is fumbling the hand held device and moving the device to a proper photographic position, the hand held device may sense such changes in positions, and the like, as the user command to take a picture. Accordingly, without a properly set threshold, pictures may be taken at the wrong times.

In various embodiments, if the magnitude of the perturbation exceeds the threshold, the desired function may be performed, step 560. In light of the present patent disclosure, one of ordinary skill in the art will recognize many different types of applications may be performed within embodiments of the present invention.

Merely by example, one application may be recording acceleration data in three-dimensions with respect to time. In such an example, the user may invoke the software application on the computing device, however, the actual recording of the data is initiated in step 560, only after a sufficient change in acceleration is sensed. Such an application may be useful for data logging purposes for a vehicle (e.g. a black box), may be useful for data logging for sports activities (e.g. monitoring movement of a golf club, fishing rod, racquet), may be useful for data logging of freight (e.g. monitoring how roughly freight is handled), or the like. In various examples, other types of perturbations other than the triggering perturbation may also be logged, in the embodiments above. For example, for data logging of sports activities, the rotation in three axis of a golf club may also be recorded in addition to the linear acceleration of the golf club, in three-dimensions.

As another example, one application may be recording magnetic data stored on a magnetic storage media (e.g. a magnetic stripe (e.g. a bank card, credit card); magnetic ink (e.g. currency, commercial or consumer paper, negotiable instruments); or the like. Representative examples include a handheld device, such as a phone, applications device (e.g. Apple iPad) or the like, including one or more magnetic field sensors, as disclosed in the above-mentioned patent application. In some embodiments of the present invention, the sensitivity of such magnetic sensors may range from approximately: 0.8 mV/V/Oe to 1 mV/V/Oe to approximately 1.2 mV/V/Oe, or the like; and the field range of such magnetic sensors may be adjusted by gain and may be within the range from approximately, +/−1 Oe, to +/−2 Oe, to +/−4 Oe, to +/−8 Oe to +/−12 Oe, or the like. In such devices, a software application running on the computing device may be designed to read magnetic field data external to the device, using the included magnetic sensors. In various examples, the application may monitor the data from the magnetic sensors when the magnetic stripe of a credit card, or the like is moved (e.g. slowly) over the device. In other embodiments, the device may be moved relative to the credit card, or the like.

In various embodiments, the magnetic sensors can separately read any of the three or more tracks recorded on typical credit card magnetic stripes, drivers licenses, or the like, depending upon the orientation of the magnetic stripes relative to the magnetic sensors. Such embodiments may include magnetic shielding to help isolate track data. In various embodiments, the encoded data stored on any or all of the tracks can be individually sensed or read. In various embodiments, the magnetic sensors may configured such that the magnetic data on a credit card, or the like may be sensed on the rear portion of a device, e.g. through the casing; or the magnetic sensors may be configured to sense magnetic data on the front portion of a device, e.g. over the display. For the former example, a line, a black mark, a circle or the like may be a physical feature or a graphic feature provided on the rear portion of the device to help the user align the magnetic tracks to the magnetic sensors. Examples of the magnetic sensor being on the front portion of a device and the magnetic sensor being on the back portion of a device are illustrated below.

FIGS. 4C-D illustrate a process according to various embodiments of the present invention. FIG. 4A illustrates a computing device 600, having a display 610 and a magnetic sensor 620. Similar the embodiments described above, computing device 600 may be embodied as a hand-held device, a cell-phone, an applications platform, or the like. Further, magnetic sensor 620 may be a magnetic sensing element that is embedded into computing device 600 and configured to sense magnetic fields above display 610, for example. In various embodiments, magnetic sensor 620 may be a MEMS based magnetic sensor. Further, in various embodiments, magnetic sensor 620 may be a MEMS based magnetic sensor having high sensitivity, high field range, and low-noise, such as a MEMS based magnetic sensor described in the patent application incorporated by reference, above.

In FIG. 4B, a processor of computing device 600 is programmed to run an application program that provides a graphical user interface (GUI) 630 on display 610. In various embodiments, GUI 630 may include textual information, as well as graphical images 640. In the example illustrated in FIG. 4A, GUI 630 instructs the user to hold up their magnetic storage media, e.g. credit card, adjacent to display 610 as shown by graphical image 640. In various embodiments, graphical image 640 serves as a visual guide to the user for aligning the magnetic storage media relative to magnetic sensor 620 for the subsequent steps. In various embodiments, graphical image 640 may also include graphical image 645 that helps the user maintain alignment of a magnetic storage media relative to magnetic sensor 620.

As illustrated in FIG. 4C, the user holds up magnetic storage media 650 according to the instructions in GUI 610. In various embodiments, when user the magnetic storage media is placed in such an orientation or alignment, magnetic sensor 620 may be aligned to a particular magnetic track of magnetic storage media 650. For example, based upon graphical image 740, magnetic sensor 620 may be aligned to any of the three magnetic tracks found on typical credit cards, for example. As one example, an application may visually instruct the user 660 to position magnetic storage media 650 such that magnetic sensor 620 is aligned to track one, then the application may visually instruct the user 660 to position magnetic storage media 650 such that magnetic sensor 620 is aligned to track two, or the like.

In various embodiments, when magnetic sensor 620 senses magnetic media from magnetic storage media 650 positioned above magnetic sensor 620, the application program progresses to the next state.

As illustrated in FIG. 4D, in various embodiments, the processor running the application program provides GUI 670. In various embodiments, GUI 670 may include textual information, as well as graphical and/or moving images 680. In the example illustrated in FIG. 4D, GUI 670 instructs the user to carefully move magnetic storage media 650 along display 610. As illustrated, graphical image 645 may along with graphical image 640 to provide user 660 with visual feedback.

By doing this, magnetic storage media 650 is passed across magnetic sensor 620, and data stored on the appropriate track is read by magnetic storage media 650. In various embodiments, the read data is used by the application program. For example, in various embodiments, if magnetic storage media 650 is a credit card, the credit card number, name, and the like can be read; if magnetic storage media 650 is a license, a name, physical characteristics, address, and the like can be read; and the like. The application may then provide the data to a remote server for storage or for further processing, for example, providing the credit card number and expiration date to a web-based retailer, or the like; providing a drivers license number to law enforcement agencies; or the like.

In other embodiments of the present invention, a user may be instructed to place their finger, thumbnail, another credit card or the like along the display to aid in alignment of the magnetic sensors relative to the magnetic track, or the like. For example, the user may be instructed to place a finger of their other hand on location 690 to keep the top edge of magnetic storage media 650 properly aligned to magnetic sensor 620. As another example, the user may be instructed to place another credit card, or the like along line 695, and then use the edge of that credit card as a guide for moving their credit card across the face of the device.

In other embodiments of the present invention, the application may operate in a landscape orientation compared to the portrait orientation illustrated in FIGS. 4A-D. Further, with larger display devices, e.g. tablet computer (iPad), the graphical user interfaces may be adjusted for the smaller relative size of the magnetic storage media, e.g. credit card.

Figure 5A:
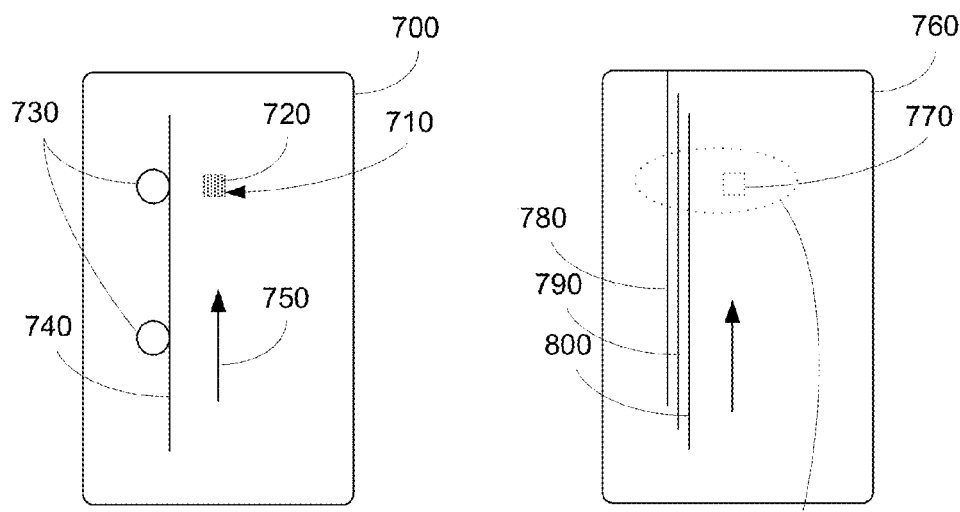
FIGS. 5A-D illustrate a process according to various embodiments of the present invention.

FIGS. 5A-D illustrate a process according to various embodiments of the present invention. FIG. 5A illustrates a back of a computing device 700, having a magnetic sensor 710. Similar he embodiments described above, computing device 700 may be embodied as a hand-held device, a cellphone, an applications platform, or the like. Further, magnetic sensor 710 may be a magnetic sensing element that is embedded into computing device 600 and configured to sense magnetic fields above display 610, for example. In various embodiments, magnetic sensor 710 may be a MEMS based magnetic sensor. Further, in various embodiments, magnetic sensor 710 may be a MEMS based magnetic sensor having high sensitivity, high field range, and low-noise, such as a MEMS based magnetic sensor described in the patent application incorporated by reference, above.

Figure 5B:
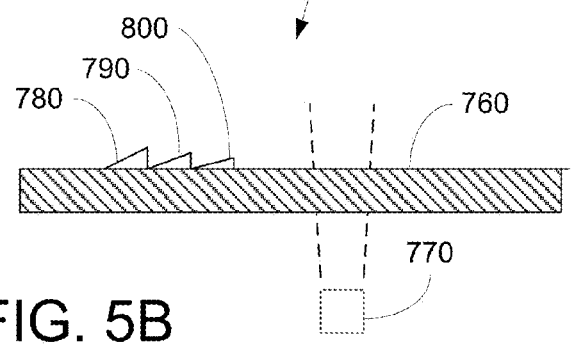

In FIG. 5B, a back of a computing device 760 may have a series of ridges 780-800. In various embodiments, series of ridges 780-800 may protrude from the back of computing device 760 as shown in the side-view in FIG. 5B. As illustrated, magnetic sensor 770 can be located within computing device 760 and need not be positioned adjacent to the back of computing device 760.

Figure 5C:
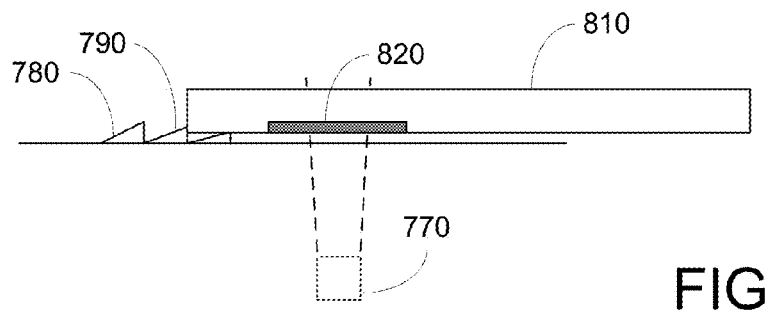
Figure 5D:
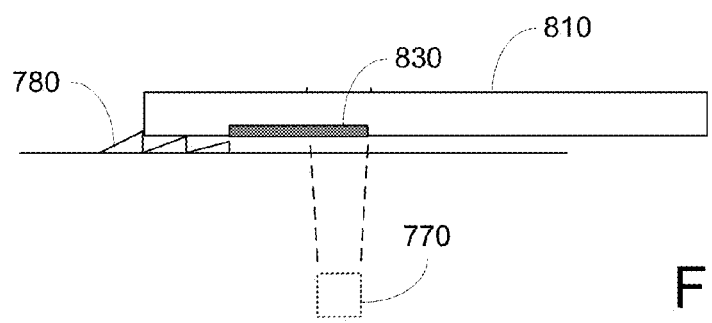

In operation, as illustrated in FIG. 5C, a magnetic storage media 810, e.g. a credit card, having a magnetic strip 820 is shown. As mentioned above, in various embodiments, magnetic strip 820 may include one or more magnetic tracks. In the example shown, when the user pushes magnetic storage media 810 against ridge 790, magnetic sensor 770 is positioned to read data from the middle magnetic track. In the example shown in FIG. 5D, when the user pushes magnetic storage media 810 against ridge 780, magnetic sensor 770 is positioned to read a bottom magnetic track. Further, when the user pushes magnetic storage media 810 against ridge 800, magnetic sensor 770 is positioned to read data from the top magnetic track. Accordingly, as shown, data can be read from any track on the magnetic stripe, depending upon which ridge the credit card is aligned against.

In other embodiments of the present invention, a user may be instructed to place their fingers, thumbnail, another credit card or the like along the display to aid in alignment of the magnetic sensors relative to the magnetic track, or the like. For example, the user may be instructed to place fingers on locations 730 to keep the top edge of a magnetic storage media properly aligned to magnetic sensor 710. As another example, the user may be instructed to place another credit card, or the like along line 740, and then use the edge of that credit card as a guide for moving their credit card across magnetic sensor 710. In various embodiments, an optical mark 720 may be provided to give the user an indication of the reading position of magnetic sensor 770.

In various embodiments, the sensed data may then be used as input to other applications, for example, the credit card number, and other data may be provided for e-commerce applications. In other examples, the magnetic sensors can read magnetic data stored on identification cards, e.g. drivers' licenses, or the like and provide such data to a security program or for security purposes. In other examples, the magnetic sensors can be used to monitor magnetic attached or implanted into a person's body for surveillance or monitoring purposes, or the like.

In still other embodiments, the magnetic sensors may be used to sense and track the localized presence of magnetizable materials (e.g. higher magnetic permeability), such as iron, nickel, steel, another magnet or the like. This may be done by sensing localized perturbations in a global magnetic field (e.g. the Earth's magnetic field) due to the steel, magnet, or the like. In various embodiments, the tracking may be in two dimensions, e.g. along the display plane or surface of the device; or in three dimensions, e.g. along the display plane of the device, in addition to towards and away from the display plane of the device. As merely an example, the magnetic sensors may be use to track the position of a metal tip of a pen (having a steel ball, iron alloy ball, or the like). For example, a user may "sign" their name on a display of a device by moving the metal-tipped pen across the surface of a display. Although the device may not officially support an external stylus (e.g. iPad), the position of the metal or magnetic-tipped pen tip may be tracked by the on-board magnetic sensors and used. Further, with appropriate pre-calibration between the magnetic sensors and positions on the display of the device, with the sensed data, the display may visually indicate or reflect the positions of the pen on the display. Accordingly, the display can track and display the path drawn by the user across the face of the display. In some examples, the user can then enter hand written notes, sign their name (e.g. signature), or the like on the display by using an ordinary pen. In other embodiments, the user can interact with the user interface of their device with an ordinary metal-tipped pen to perform customary functions such as invoke applications, select data, surf the web, drag and drop, or the like in a similar way they may use their finger(s).

In still other embodiments, the magnetic sensors can track the location of a magnet or metal material (e.g. magnetizable material) in three-dimensions relative to the device. In such embodiments, pre-calibration may be necessary to correlate the locations of magnetic or metal material in three-space. For example, the user may be initially instructed to position the magnet or metal material at certain x, y and z positions relative to the device, e.g. at lattice corners. In various embodiments, once located at specified locations, the magnetic field data sensed by the magnetic sensors is recorded to determine the calibration data. Subsequently, as the user moves the magnet or metal material in three-space, the magnetic sensor data is compared to the calibration data to determine the location of the magnet or metal material in x, y and z space. In one application, the magnetic or metal material may first be positioned at a location on a sculpture; next based upon the magnetic sensor data, the x, y and z position of that location on the sculpture, the x, y and z space coordinates are determined; subsequently, this process is then repeated for other locations on the sculpture. By doing so, in various embodiments, the three-dimensional shape or surface of the sculpture, or the like may be effectively digitized.

As another example, one application may be logging of pressure for scuba diving or for flying. In such an example, a software application running on the computing device may be designed to read pressure data using the included air pressure sensors. In such an example, the application may monitor the air pressure sensor, and when the pressure changes at a sufficient rate (e.g. faster than the weather changing), the computing device may record the change in pressures with respect to time. In the case of a scuba diving application, the pressure may be correlated to diving depth versus time. Such data can then be used by the software application to notify the diver of decompression depths and durations, whether decompression is required, and the like. In the case of a flying application, the air pressure may be correlated to flying altitude. Such data can then be used to warn the user if there is a slow decompression leak in the cabin, to monitor the altitude versus time (e.g. black box), or the like.

As another example, one application may be capturing one or more images of a camera in response to the user tapping upon the case (e.g. back, side, edge) of a device (e.g. phone). For example, while the user points the high resolution camera of their device at the target (e.g. themselves for a self portrait) the user taps the side of the camera. In various embodiments, such a method for initiating capturing of photographs or images is considered by the inventors as a superior method for taking pictures compared to a user blindly pressing software buttons (mashing) their fingers on a GUI on the display screen, which they cannot see. This sort of situation is commonly found of devices such as the iPhone 4, droid X, HTC Evo 4G for example, when the user takes a high resolution (e.g. ~≥3mp) self portrait; when the user is taking a picture in bright sunlight; or the like. In various embodiments, in response to the command for initiating capturing of photographic images (e.g. a sufficiently hard device case finger tap), after a short delay to enable the camera to become stable again, the image may be taken. In various embodiments, the image may be captured once the device becomes stationary (as determined by accelerometers), after the finger tap; a short amount of time after the finger tap; or the like.

In various embodiments, the hand held device may capture a series of images into a temporary storage and determine one or more images to keep based upon optical parameters of the images (e.g. which image has the least amount of blur); based upon image parameters of the images (e.g. which image has the fastest shutter speed); physical parameters of the hand held device (e.g. which image was taken at a time having the least amount of associated physical movement based upon the accelerometers, gyroscopes, or the like). In other embodiments, the hand held device may decide when to take a picture based upon acceleration of the device. For example, the movement of the hand held device may be monitored, and then when the movement/acceleration is very small, the camera of the hand held device may be triggered.

In various embodiments the magnitude of the acceleration can be used to set camera parameters such as aperture, iso rating, shutter speed, and the like. For example, if the magnitude of acceleration is considered large (for example, indicating a urgent, hurried photographic environment), the shutter speed may be increased, the iso may be increased, the aperture may be decreased (increasing the depth of field), a number of photographs in a burst taken may be increased, or the like; if the magnitude of acceleration is considered small (for example, indicating a quiet, less hurried photographic environment) a volume for a shutter sound may be decreased, the iso may be decreased, the aperture may be decreased (decreasing the depth of field), or the like.

In other embodiments, the user tapping on the case, as described above, may be used to initiate other types of operations by the computer system. For example a single tap on the back of the computer system may initiate a process for recording audio signals via a microphone, and a double tap on the back may pause or finish the recording of audio signals. As merely another example, a single tap may be used by a user to answer a telephone call, a double tap may be used to mute and unmute a telephone call, a triple tap may be used by the user to hang up the telephone call. A tap near the top of the computer system device may increase the audio playback volume and a tap near the bottom of the device may decrease the playback volume, or the like.

Further embodiments can be envisioned to one of ordinary skill in the art after reading this disclosure. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

Figure 6:
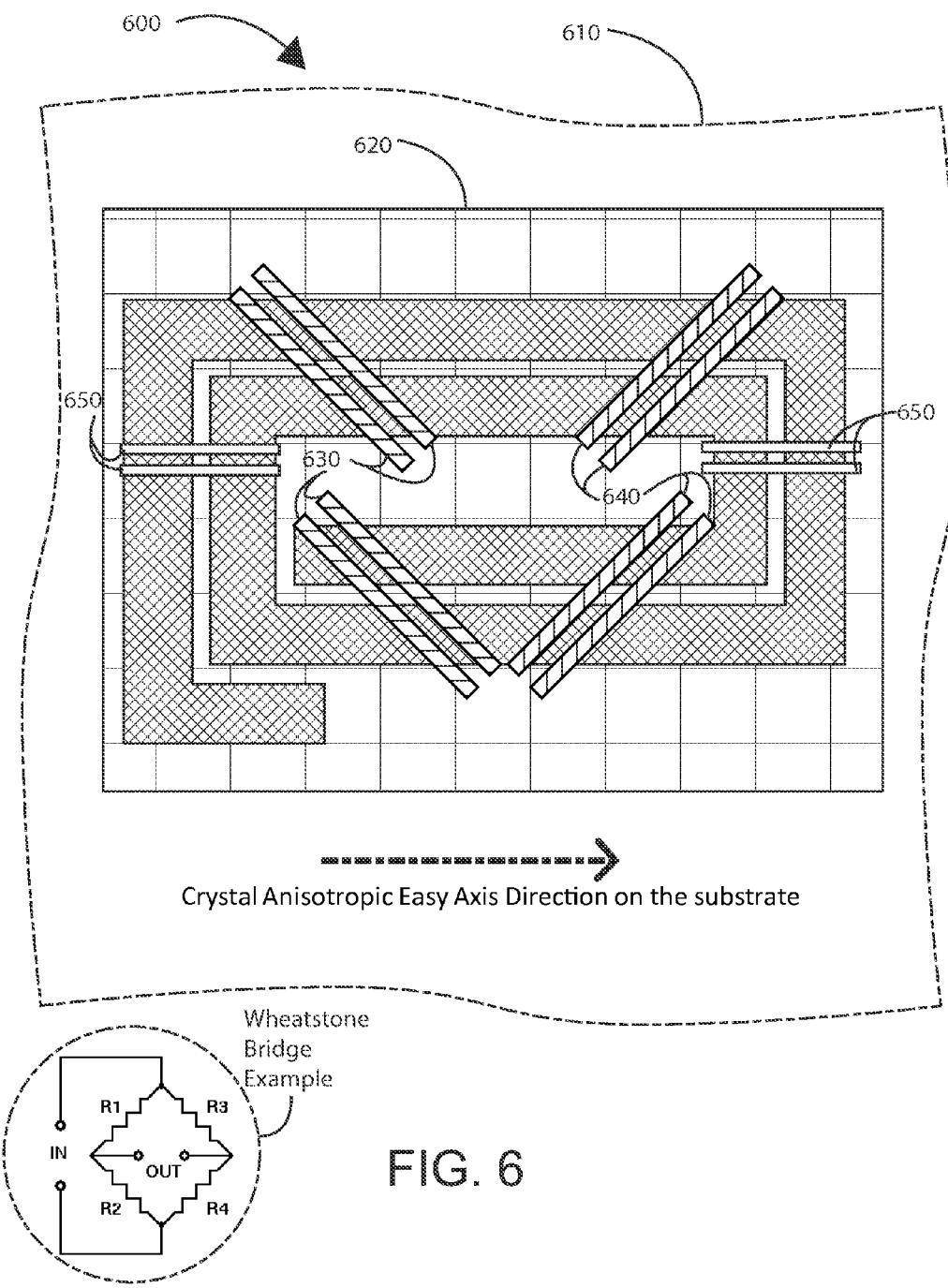
FIG. 6 is a simplified top diagram of a device for sensing magnetic fields according to an embodiment of the present invention.

FIG. 6 is a simplified top diagram of a device for sensing magnetic fields according to an embodiment of the present invention. This diagram, which can represent a three-axis magnetic field sensor device, is merely an example, which should not unduly limit the scope of the claims herein. One of ordinary skill in the art would recognize many other variations, modifications, and alternatives. As shown, device 600 includes a substrate 610, an integrated circuit (IC) layer 620, a first magnetic field sensor element 630, a second magnetic field sensor element 640, and a third magnetic field sensor element 650. FIG. 6 shows the third magnetic field sensor element in a configuration that is aligned to a crystal easy axis.

In an embodiment, substrate 610 can have a surface region. In a specific embodiment, substrate 610 can include a buried oxide (BOX) substrate. Substrate 610 can include a substrate-on-insulator (SOI) substrate. In another specific embodiment, substrate 610 can include an epitaxial (EPI) material. In further embodiments, substrate 610 can have a silicon, single crystal silicon, or polycrystalline silicon material. Substrate 610 can also include metals, dielectrics, polymers, and other materials and combinations thereof.

In an embodiment, IC layer 620 can be formed overlying at least one portion of the surface region. In a specific embodiment, IC layer 620 can include an application specific integrated circuit (ASIC) layer, or other type of IC layer or combination thereof. Also, IC layer 620 can include at least one IC device, CMOS device, or other device. IC layer 620 can be coupled to the magnetic field sensor elements 630, 640, and 650.

In an embodiment, first magnetic field sensor element(s) 630, second magnetic field sensor element 640, and third magnetic field sensor element 650 can be formed overlying at least one portion of the surface region. Magnetic field sensor elements 630, 640, and 650 can include ordinary magneto-resistive (OMR) device(s), anisotropic magneto-resistive (AMR) device(s), giant magneto-resistive (GMR) device(s), or tunnel junction magneto-resistive (TMR) device(s). Elements 630, 640, 650 can also be other types of magnetic field sensor devices, sensors, or combinations thereof. In a specific embodiment, magnetic field sensor elements 630, 640, and 650 can include thin film devices that can be deposited overlying at least one portion of the surface region. The thin film device(s) can be deposited by a sputtering process or an electric plating process. In a specific embodiment, magnetic field sensor elements 630, 640, and 650 are formed as a Wheatstone bridge, a half bridge, or a single element. In an embodiment, magnetic field sensor elements 630, 640, 650 can include at least one layer of dielectric material and/or metal material.

Integrating a three-axis magnetoresistive (MR) sensor device on a single chip has been challenging because thin film MR sensors are only sensitive to the magnetic field parallel to the plane of the thin film. This limitation is due to the strong shape anisotropic field in the out of plane direction. The magnetic thin film also has a crystal anisotropic field, which makes the crystal anisotropic easy direction a preferred configuration for the sensors.

In an embodiment, the design of a single chip 3-axis magnetic sensor device can be based on magneto-resistive technologies including, but not limited to, Anisotropic Magneto-Resistive (AMR), Giant Magneto-Resistive (GMR), and Tunnel Magneto-Resistive (TMR) effects. In a specific embodiment, a vertical field can be channeled to magnetic thin film plane through a field (flux) concentrator, which can be used effectively as a Z-field sensor.

The Z-field sensor can be designed in any orientation on the thin film plane. For example, the sensor can be designed to have the best sensor performance, such as being configured in a sensitive direction on the crystal hard axis to have lower electric/magnetic noise, or aligned with X or Y sensors for easy calibration. The Z-axis sensor can be designed to be a gradient magnetic field sensor, making it highly insensitive to any uniformly applied field on the horizontal plane. This design can cause the Z-axis sensor's output to be proportional to the Z-axis field channeled through field (flux) concentrator. However, due to manufacturing imperfection and tolerance, the four elements (or two elements for half bridge) of Z-axis sensor might not be perfectly identical or symmetrical to the field (flux) concentrator elements. In some cases, the field (flux) concentrator element may not be identical, which may require calibration of the concentrators to the substrate because the horizontal field may influence the Z-axis sensor performance.

For horizontal X-Y configurations, the sensors can be configured as Wheatstone bridges or half bridges with four elements. The sensitive direction of the x-axis sensor is 45 degrees away from the crystal anisotropic easy axis direction of the substrate, and the sensitive direction of the y-axis sensor is −45 degrees of the crystal easy axis. The X and Y sensors can be configured to be symmetrical to the crystal hard axis in order to match the sensor's sensitivities.

By using a single Set/Reset strap (shown as the material formed in a spiral shape underneath the sensors in FIGS. 1-3) for X-Y sensors, the magnetization of both X and Y sensors will be aligned upon initialization. As a current pulse passes through the Set/Reset strap, a localized magnetic field is generated on the sensor elements right above or below the strap. In various embodiments, the pulse current is strong enough to align magnetic domains in the MR sensor elements substantially to its field direction. Upon releasing the pulse current, magnetization of X-Y sensors relax to their easy axis directions of their total anisotropic field, and form sensitivities in the x-axis or y-axis direction. The X-Y Sensors are field sensors, which means the output voltage is proportional the magnetic field strength in their sensitive directions.

Z sensor can share the set/reset strap with the X-Y sensors. Z sensor is a gradient sensor, which means the output voltage is proportional to the field differences along its sensitive direction. Z sensor can be parallel to the x-axis sensor, the y-axis sensor, or in the different orientation altogether. As stated previously, those skilled in the art will recognize other variations, modifications, and alternatives.

Figure 7:
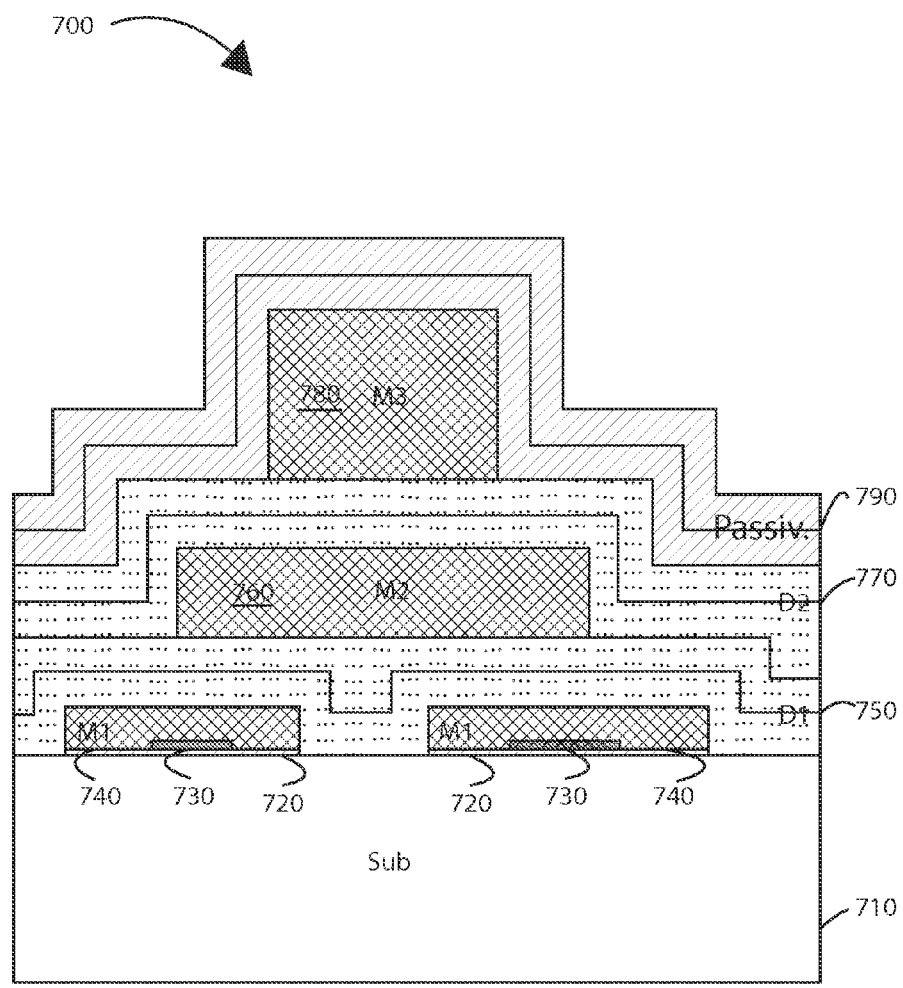
FIG. 7 is a simplified cross-sectional diagram of a device for sensing magnetic fields according to an embodiment of the present invention.

FIG. 7 is a simplified side diagram of a sensor device or electronic device according to an embodiment of the present invention. This diagram is merely an example, which should not unduly limit the scope of the claims herein. One of ordinary skill in the art would recognize many other variations, modifications, and alternatives. As shown, device 700 includes a substrate 710, insulation material(s) 720, permalloy material(s) 730, metal materials {740, 760, 780}, dielectric materials {750,780}, and passivation material(s) 790.

In an embodiment, substrate 710 can include a substrate-on-insulator (SOI) substrate. In specific embodiment, the substrate can include an epitaxial (EPI) material. In further embodiments, substrate 710 can have a silicon, single crystal silicon, or polycrystalline silicon material. Substrate 710 can also include metals, dielectrics, polymers, and other materials and combinations thereof. Insulation material(s) 720 can include dielectric materials, oxide materials, silicon materials, or other materials and combinations thereof.

In a specific embodiment, permalloy material(s) 730 can include a nickel iron (NiFe) material, a nickel iron cobalt (NiFeCo) material, or other permalloy material or combination thereof. According to Wikipedia, "permalloy is a term for a nickel iron magnetic alloy typically having about 20% iron and 80% nickel content." Permalloy material(s) 730 can be formed via an electric plating process or sputtering process.

In an embodiment, at least one first metal material 740 can be formed overlying at least one portion of permalloy material(s) 730 and the surface region. First metal material(s) 740 can include aluminum, or copper, or a metal alloy, other metal material or combination thereof. A first dielectric material 750 can be formed overlying the first metal material(s) and the surface region. First dielectric material 750 can include a silicon oxide material, or other oxide material, or combination thereof. At least one second metal material 760 can be formed overlying at least one portion of first dielectric material 750. Second metal material(s) 760 can include materials similar to those in first metal material(s) 740.

A second dielectric material 770 can be formed overlying second metal material(s) 760 and at least one portion of first dielectric material 750. Second dielectric materials 770 can include materials found in the first dielectric material mentioned previously. At least a third metal material 780, which can include similar materials used in the metal materials mentioned previously, can be formed overlying at least a portion of second dielectric material 780. At least one passivation material 790 can then be formed overlying third metal material(s) 780 and second dielectric material 770. Passivation material(s) 790 can include dielectric materials, oxide materials, or silicon materials, or other materials or combinations thereof.

Figure 8:
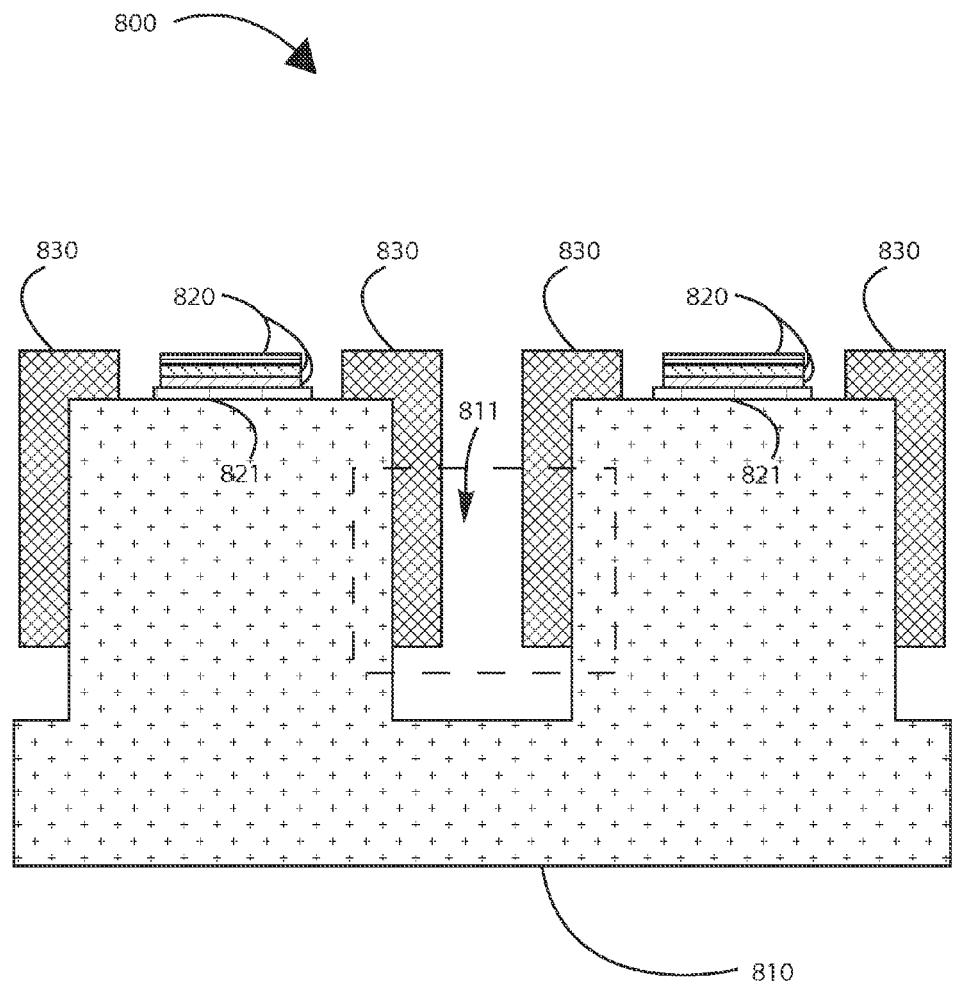
FIG. 8 is a simplified cross-sectional diagram of a device for sensing magnetic fields according to an embodiment of the present invention.

FIG. 8 is a simplified side diagram of a sensor device or electronic device according to an embodiment of the present invention. This diagram is merely an example, which should not unduly limit the scope of the claims herein. One of ordinary skill in the art would recognize many other variations, modifications, and alternatives. As shown, device 800 includes a substrate 810, at least one application specific integrated circuit (ASIC) material 821, at least one magnetic field sensing element 820, and at least one magnetic field concentrator 830.

In an embodiment, substrate 810 can have a top surface region. In a specific embodiment, substrate 810 can include a buried oxide (BOX) substrate. Substrate 810 can include a substrate-on-insulator (SOI) substrate. In another specific embodiment, substrate 810 can include an epitaxial (EPI) material. In further embodiments, substrate 810 can have a silicon, single crystal silicon, or polycrystalline silicon material. Substrate 810 can also include other materials and combinations thereof.

In an embodiment, substrate 810 can have at least one portion removed to form at least one lateral surface region, as shown by region 811. The removal of portion(s) of substrate 810 can include a wet etching, dry etching, or mechanical process. In a specific embodiment, the removal of portion(s) of substrate 810 can include a deep reactive-ion etching (DRIE) process. The removal process can include other processes and combinations thereof. In an embodiment, device 800 can include an insulating material, which can be formed overlying at least one portion of the top surface region of substrate 810. In an embodiment, the insulating material can be formed overlying at least one portion of the lateral surface region(s). ASIC material 821 can be formed overlying at least one portion of substrate 810. In various embodiments, ASIC material 821 can include a variety of ICs related to signal conditions and the like.

In an embodiment, magnetic field sensor element(s) 820 can be formed overlying at least one portion of the top surface region. Magnetic field sensor element(s) 820 can include ordinary magneto-resistive (OMR) device(s), anisotropic magneto-resistive (AMR) device(s), giant magneto-resistive (GMR) device(s), or tunnel junction magneto-resistive (TMR) device(s). The device(s) 820 can also be other types of magnetic field sensor device(s), sensors, or combinations thereof. In a specific embodiment, magnetic field sensor element(s) 820 can include thin film devices that can be deposited overlying at least one portion of the top surface region. The thin film device(s) can be deposited by a sputtering process or an electric plating process. In a specific embodiment, magnetic field sensor element(s) 820 are formed through as a Wheatstone bridge, a half bridge, or a single element configuration. In an embodiment, magnetic field sensor element(s) 820 can include at least one layer of dielectric material and/or metal material.

In an embodiment, magnetic field concentrator(s) 830 can be formed overlying at least one portion of the lateral surface region(s). In an embodiment, magnetic field concentrator(s) 830 can also be spatially formed overlying at least one portion of the top surface region. In a specific embodiment, magnetic field concentrator(s) 830 can include a nickel-iron material. Magnetic field concentrator(s) 830 can also include other materials, compositions, and combinations thereof. Magnetic field concentrator(s) 830 can include permalloy material having high permeability. In various embodiments, the material for magnetic field concentrators 830 may be the same as the material for magnetic field sensor elements 820, and may be deposited in the same operation. Subsequently, using conventional etching processes, magnetic field concentrators 830 and magnetic field sensor elements 820 may then be separated or defined. In a specific embodiment, magnetic field concentrator(s) 830 can be formed via an electric plating process or sputtering process. Then, a passivation material can be formed overlying at least magnetic field sensor element(s) 820. As stated, there can be other variations, modifications, and alternatives.

Figure 9:
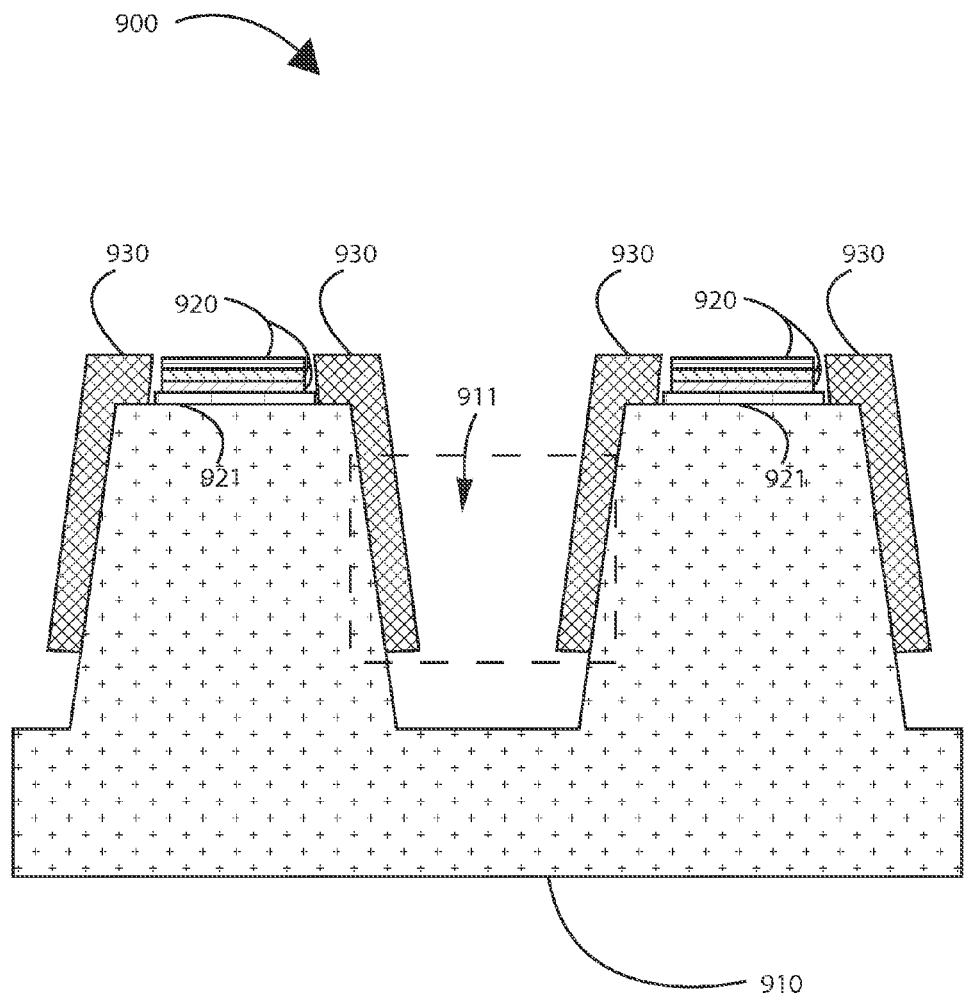
FIG. 9 is a simplified cross-sectional diagram of a device for sensing magnetic fields according to an embodiment of the present invention.

FIG. 9 is a simplified side diagram of a sensor device or electronic device according to an embodiment of the present invention. Compared to FIG. 8, this diagram can represent another configuration of the device components. This diagram is merely an example, which should not unduly limit the scope of the claims herein. One of ordinary skill in the art would recognize many other variations, modifications, and alternatives. As shown, device 900 includes a substrate 910, at least one application specific integrated circuit (ASIC) material 921, at least one magnetic field sensing element 920, and at least one magnetic field concentrator 930. A detailed description regarding the elements of FIG. 9 can be found above in the description for FIG. 8. Those skilled in the art will recognize other variations, modifications, and alternatives.

Figure 10:
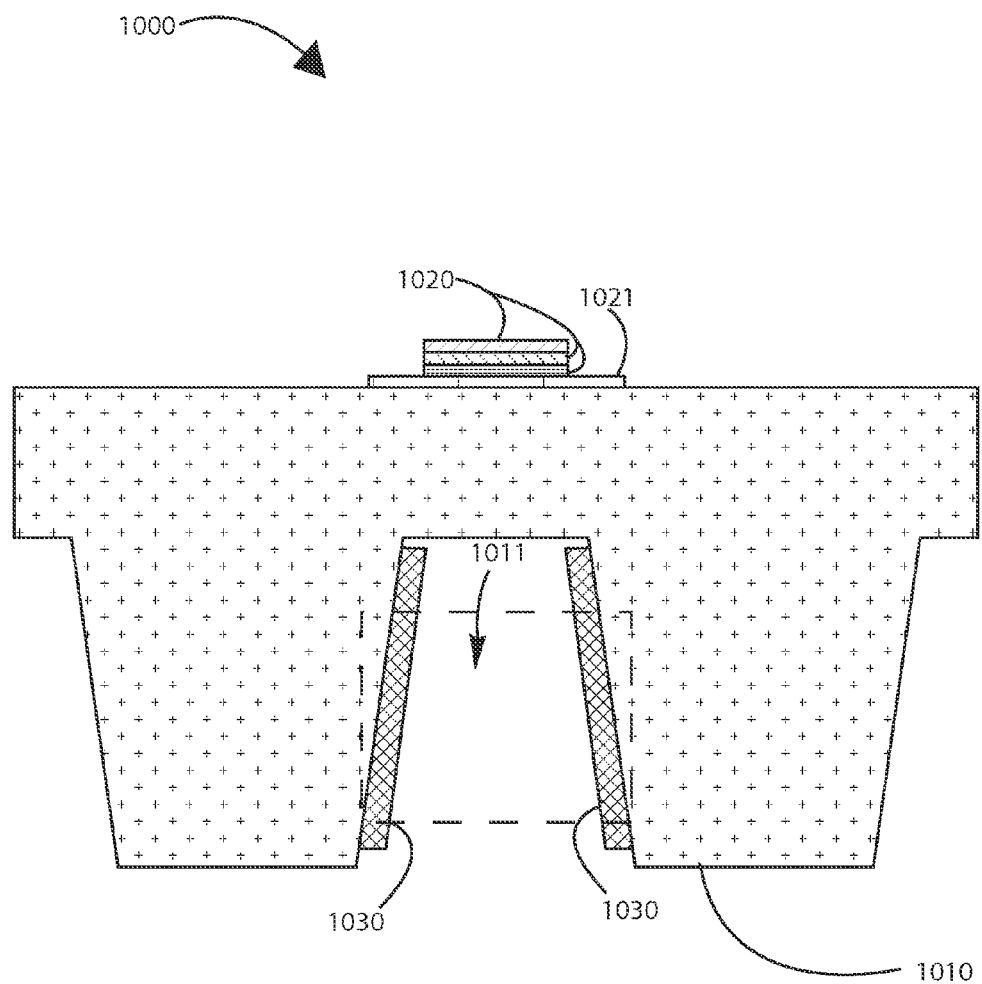
FIG. 10 is a simplified cross-sectional diagram of a device for sensing magnetic fields according to an embodiment of the present invention.

FIG. 10 is a simplified cross-sectional diagram of a sensor device or electronic device according to an embodiment of the present invention. Compared to the previous two figures, FIG. 10 can represent yet another configuration of the device components. This diagram is merely an example, which should not unduly limit the scope of the claims herein. One of ordinary skill in the art would recognize many other variations, modifications, and alternatives. As shown, device 1000 includes a substrate 1010, at least one application specific integrated circuit (ASIC) material 1021, at least one magnetic field sensing element 1020, and at least one magnetic field concentrator 1030. A detailed description regarding the elements of FIG. 10 can be found above in the description for FIG. 8. Those skilled in the art will recognize other variations, modifications, and alternatives.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A handheld device comprising:
   a housing;
   a display;
   a MEMS magnetic field sensor disposed within the housing, wherein the MEMS magnetic field sensor is configured to sense a plurality of perturbations in magnetic fields in response to a magnetic storage media when the user displaces the magnetic storage media in three-dimensional space relative to the handheld device;
   wherein the MEMS magnetic field sensor includes
      a substrate member having a surface region and one or more lateral surface regions,
      an integrated circuit (IC) layer spatially disposed overlying at least a portion of the surface region,
      a first magnetic field sensor element comprising at least a first material and configured to detect at least in a first direction, the first magnetic field sensor element being operably coupled to the IC layer, a second magnetic field sensor element comprising at least the first material and configured to detect at least in a second direction, the second magnetic field sensing element being operably coupled to the IC layer, a third magnetic field sensor element comprising at least the first material and configured to detect at least in a third direction, the third magnetic sensing element being operably coupled to the IC layer, and at least one magnetic field concentrator spatially formed overlying at least one portion of the surface region and a portion of the one or more lateral surface regions;

wherein the first material comprises thin film materials;

wherein the first, second, and third directions are mutually orthogonal; and a processor disposed within the housing and coupled to the MEMS magnetic field sensor and to the display, wherein the processor is programmed to receive the plurality of perturbations in magnetic fields, wherein the processor is programmed to determine a plurality of stored data in response to the plurality of perturbations in magnetic fields from the magnetic storage media.

2. The handheld device of claim 1 wherein the MEMS magnetic sensor comprises a MEMS magnetic sensor manufactured using a foundry compatible process.

3. The handheld device of claim 1 wherein the MEMS magnetic sensor comprises a three-axis magnetic field sensor.

4. The handheld device of claim 1 further comprising a MEMS pressure sensor disposed within the housing, wherein the MEMS pressure sensor is configured to sense a plurality of perturbations in air pressure in response to the user spatially displacing the handheld device.

5. The handheld device of claim 4 wherein the processor is programmed to receive the plurality of perturbations in air pressure, wherein the processor is programmed to determine a rate of change in pressure in response to the plurality of perturbations in air pressure, and wherein the processor is programmed to output an indication of the rate of change of air pressure on the display.

6. The handheld device of claim 1 wherein the MEMS magnetic sensor is configured to determine the plurality of perturbations in the magnetic fields in response to a magnetic storage media selected from a group consisting of: a credit card, a license card, and a card with one or more magnetic tracks.

7. The handheld device of claim 1
wherein the MEMS magnetic field sensor is configured to sense another plurality of perturbations in magnetic fields in response to a perturbation source when the user displaces the perturbation source in three-dimensional space relative to the handheld device;
wherein the processor is programmed to determine a plurality of spatial locations in three dimensional space in response to the another plurality of perturbations in the magnetic fields; and
wherein the processor is programmed to output an indication of the plurality of spatial location on the display.

8. The handheld device of claim 7 wherein the magnetic fields comprise Earth magnetic fields.

9. The handheld device of claim 7
wherein the user displaces the perturbation source within a plane of a front surface of the display; and
wherein the display is configured to reflect a two-dimensional path of the perturbation source with respect to the display.

10. The handheld device of claim 7 wherein the processor is programmed to determine a digitized shape from the plurality of spatial locations, wherein the processor is programmed to output an indication of the digitized shape on the display.

11. A method for a handheld computer system for processing data stored in a magnetic storage media, the method comprising:
sensing, in a MEMS magnetic field sensor disposed within the handheld computer system, a plurality of perturbations in magnetic fields in response to a user spatially displacing the magnetic storage media in three-dimensional space relative to the handheld device;
wherein the MEMS magnetic field sensor includes:
a substrate member having a surface region and one or more lateral surface regions,
an integrated circuit (IC) layer spatially disposed overlying at least a portion of the surface region,
a first magnetic field sensor element comprising at least a first material and configured to detect at least in a first direction, the first magnetic field sensor element being operably coupled to the IC layer,
a second magnetic field sensor element comprising at least the first material and configured to detect at least in a second direction, the second magnetic field sensing element being operably coupled to the IC layer,
a third magnetic field sensor element comprising at least the first material and configured to detect at least in a third direction, the third magnetic sensing element being operably coupled to the IC layer, and
at least one magnetic field concentrator spatially formed overlying at least one portion of the surface region and a portion of the one or more lateral surface regions;
wherein the first material comprises thin film materials;
wherein the first, second, and third directions are mutually orthogonal; and
determining, in a processor, a plurality of stored data in response to the plurality of perturbations in the magnetic fields from the magnetic storage media.

12. The method of claim 11 wherein the sensing comprises sensing in a MEMS magnetic sensor manufactured using a foundry compatible process, the handheld computer system, the plurality of perturbations.

13. The method of claim 11 wherein the sensing comprises sensing in a three-axis magnetic field MEMS magnetic sensor, the handheld computer system, the plurality of perturbations.

14. The method of claim 11 further comprising sensing in a MEMS pressure sensor disposed within the handheld computer system, a plurality of perturbations in air pressure in response to a user spatially displacing the handheld device.

15. The method claim 14 further comprising determining in the processor, a rate of change in pressure in response to the plurality of perturbations in air pressure, and displaying on the display, an indication of the rate of change in air pressure.

16. The method of claim 11 wherein the sensing comprises sensing in the MEMS magnetic field sensor disposed within the handheld computer system, the plurality of perturbations in magnetic fields in response to the user spatially displacing the magnetic storage media relative to the handheld device, wherein the perturbation source is selected from a group consisting of: a credit card, a license card, a card with one or more magnetic tracks.

17. The method of claim 11 further comprising
sensing, in the MEMS magnetic field sensor, another plurality of perturbations in magnetic fields in response to a user spatially displacing a perturbation source in three-dimensional space relative to the handheld device;

determining, in the processor, a plurality of spatial locations in three dimensional space in response to another plurality of perturbations in the magnetic fields; and displaying, on a display, an indication of the plurality of spatial location.

18. The method of claim 17 wherein the sensing comprising sensing in the MEMS magnetic field sensor disposed within the handheld computer system, the another plurality of perturbations in magnetic fields in response to the user spatially displacing the perturbation source relative to the handheld device, wherein the magnetic fields comprise Earth magnetic fields.

19. The method of claim 17 wherein the sensing comprises sensing in the MEMS magnetic field sensor disposed within the handheld computer system, the another plurality of perturbations in magnetic fields in response to the user spatially displacing the perturbation source within a plane of a front surface of the display; and wherein the displaying comprises displaying a two-dimensional path of the perturbation source with respect to the display.

20. The method of claim 17 further comprising determining in the processor, a digitized shape from the plurality of spatial locations, and displaying on the display, an indication of the digitized shape.

* * * * *